United States Patent
Nagashima et al.

(10) Patent No.: US 8,964,447 B2
(45) Date of Patent: *Feb. 24, 2015

(54) NONVOLATILE SEMICONDUCTOR MEMORY DEVICE

(75) Inventors: Hiroyuki Nagashima, Yokohama (JP); Hirofumi Inoue, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 455 days.

This patent is subject to a terminal disclaimer.

(21) Appl. No.: 13/058,952

(22) PCT Filed: Jun. 24, 2009

(86) PCT No.: PCT/JP2009/062019
§ 371 (c)(1),
(2), (4) Date: May 6, 2011

(87) PCT Pub. No.: WO2010/018715
PCT Pub. Date: Feb. 18, 2010

(65) Prior Publication Data
US 2011/0242875 A1 Oct. 6, 2011

(30) Foreign Application Priority Data
Aug. 13, 2008 (JP) ................................. 2008-208426

(51) Int. Cl.
*G11C 11/00* (2006.01)
*G11C 13/00* (2006.01)
(52) U.S. Cl.
CPC ........ *G11C 13/0007* (2013.01); *G11C 2213/72* (2013.01); *G11C 2213/31* (2013.01); *G11C 13/0011* (2013.01); *G11C 13/0004* (2013.01); *G11C 13/0023* (2013.01)
USPC .......................................... 365/148; 365/163

(58) Field of Classification Search
CPC ........... G11C 13/0069; G11C 13/0004; G11C 13/0007
USPC .......................................... 365/148, 163, 158
See application file for complete search history.

(56) References Cited

U.S. PATENT DOCUMENTS

| | | | |
|---|---|---|---|
| 5,684,732 A | 11/1997 | Sako | |
| 6,188,237 B1 * | 2/2001 | Suzuki et al. | 326/30 |

(Continued)

FOREIGN PATENT DOCUMENTS

| | | |
|---|---|---|
| EP | 1 947 652 A1 | 7/2008 |
| JP | 8 330944 | 12/1996 |

(Continued)

OTHER PUBLICATIONS

Decision of Refusal issued Oct. 16, 2012 in Japanese Patent Application No. 2008-208426 (with English translation).

(Continued)

*Primary Examiner* — Huan Hoang
(74) *Attorney, Agent, or Firm* — Oblon, Spivak, McClelland, Maier & Neustadt, L.L.P.

(57) ABSTRACT

A nonvolatile semiconductor memory device comprises a cell array including a plurality of first lines, a plurality of second lines intersecting the plurality of first lines, and a plurality of memory cells arranged in matrix and connected at intersections of the first and second lines between both lines, each memory cell containing a serial circuit of an electrically erasable programmable variable resistive element of which resistance is nonvolatilely stored as data and a non-ohmic element; and a plurality of access circuits operative to simultaneously access the memory cells physically separated from each other in the cell array.

15 Claims, 17 Drawing Sheets

(56) References Cited

U.S. PATENT DOCUMENTS

| | | |
|---|---|---|
| 6,618,286 B2 | 9/2003 | Kato et al. |
| 7,248,494 B2 | 7/2007 | Oh et al. |
| 7,957,203 B2 * | 6/2011 | Nagashima et al. ..... 365/189.04 |
| 8,089,818 B2 * | 1/2012 | Mukai et al. ............ 365/189.05 |
| 8,189,407 B2 * | 5/2012 | Strasser et al. .......... 365/189.09 |
| 8,427,885 B2 * | 4/2013 | Mukai et al. ............ 365/189.05 |
| 8,842,481 B2 | 9/2014 | Nagashima et al. |
| 2001/0003509 A1 | 6/2001 | Hosono et al. |
| 2003/0210568 A1 | 11/2003 | Eaton, Jr. et al. |
| 2005/0243595 A1 | 11/2005 | Rinerson et al. |
| 2006/0158922 A1 | 7/2006 | Takemura |
| 2007/0285969 A1 * | 12/2007 | Toda et al. .................... 365/148 |
| 2009/0109738 A1 * | 4/2009 | Donze et al. .................. 365/163 |
| 2010/0103723 A1 * | 4/2010 | Kawai et al. .................. 365/163 |
| 2010/0214828 A1 | 8/2010 | Hanzawa et al. |
| 2011/0170331 A1 * | 7/2011 | Oh et al. ....................... 365/148 |

FOREIGN PATENT DOCUMENTS

| | | |
|---|---|---|
| JP | 2002 133894 | 5/2002 |
| JP | 2004 95141 | 3/2004 |
| JP | 2005 522045 | 7/2005 |
| JP | 2006-179158 | 7/2006 |
| JP | 2006 344349 | 12/2006 |
| JP | 2007 536680 | 12/2007 |
| WO | WO 2008/032394 A1 | 3/2008 |

OTHER PUBLICATIONS

International Search Report issued Oct. 20, 2009 in PCT/JP09/062019 filed Jun. 24, 2009.

Japanese Office Action issued Jul. 24, 2012, in Japan Patent Application No. 2008-208426 (with English Translation).

Japanese Office Action issued Sep. 10, 2013, in Patent Application No. 2013-005723 with English translation.

Taiwanese Office Action dated May 28, 2013, in Patent Application No. 098122460 with English translation.

Taiwanese Office Action issued on Nov. 29, 2013, in Taiwanese Patent Application No. 098122460, filed Jul. 2, 2009, (with English language Translation).

* cited by examiner (a)

(b)

NONVOLATILE SEMICONDUCTOR MEMORY DEVICE

TECHNICAL FIELD

The present invention relates to a nonvolatile semiconductor memory device using a variable resistive element of which resistance is stored as data.

BACKGROUND ART

Electrically erasable programmable nonvolatile memories include a flash memory as well known in the art, which comprises a cell array of NAND-connected or NOR-connected memory cells having a floating gate structure. A ferroelectric memory is also known as a nonvolatile fast random access memory.

On the other hand, technologies of pattering memory cells much finer include a resistance variable memory, which uses a variable resistive element in a memory cell as proposed. Known examples of the variable resistive element include a phase change memory device that varies the resistance in accordance with the variation in crystal/amorphous states of a chalcogenide compound; an MRAM device that uses a variation in resistance due to the tunnel magneto-resistance effect; a polymer ferroelectric RAM (PFRAM) memory device including resistive elements formed of a conductive polymer; and a ReRAM device that causes a variation in resistance on electrical pulse application (Patent Document 1).

The resistance variable memory may configure a memory cell with a serial circuit of a Schottky diode and a resistance variable element in place of the transistor. Accordingly, it can be stacked easier and three-dimensionally structured to achieve much higher integration as an advantage (Patent Document 2).

When data write/erase to the memory cell changes the state of the variable resistive element, the variable resistive element and the non-ohmic element produce heat. Therefore, simultaneous data write/erase to a number of memory cells exerts a larger influence by the heat production and in turn results in the loss of data stability. This problem is further actualized by higher integration of the nonvolatile memory.

[Patent Document 1]
  JP 2006-344349A, paragraph 0021
[Patent Document 2]
  JP 2005-522045A

DISCLOSURE OF INVENTION

Technical Problem

The present invention therefore has an object to provide a nonvolatile memory capable of realizing fast operation by concurrent write/erase to plural memory cells and relieving the influence by heat produced from memory cells at the time of operation.

Technical Solution

In an aspect the present invention provides a nonvolatile semiconductor memory device, comprising: a cell array including a plurality of first lines, a plurality of second lines intersecting the plurality of first lines, and a plurality of memory cells arranged in matrix and connected at intersections of the first and second lines between both lines, each memory cell containing a serial circuit of an electrically erasable programmable variable resistive element of which resistance is nonvolatilely stored as data and a non-ohmic element; and an access circuit operative to simultaneously access plural memory cells physically separated from each other in the cell array.

In another aspect the present invention provides a nonvolatile semiconductor memory device, comprising: a cell array including plural MATs (unit cell arrays) arranged in matrix, each MAT containing a plurality of first lines, a plurality of second lines intersecting the plurality of first lines, and a plurality of memory cells connected at intersections of the first and second lines between both lines, each memory cell containing a serial circuit of an electrically erasable programmable variable resistive element of which resistance is nonvolatilely stored as data and a non-ohmic element; and a plurality of access circuits connected to the MATs and operative to simultaneously access memory cells inside the MATs, wherein the plurality of access circuits simultaneously access a certain number of memory cells inside corresponding MATs.

In yet another aspect the present invention provides a nonvolatile semiconductor memory device, comprising: a cell array including Nm MATs (unit cell arrays) (Nm=an integer of 1 or more) arranged in matrix, each MAT containing Na first lines (Na=an integer of 1 or more), Nb second lines (Nb=an integer of 1 or more) intersecting the Na first lines, and a plurality of memory cells connected at intersections of the first and second lines between both lines, each memory cell containing a serial circuit of an electrically erasable programmable variable resistive element of which resistance is nonvolatilely stored as data and a non-ohmic element; and a plurality of access circuits connected to the MATs and operative to simultaneously access memory cells inside each of the MATs, wherein a memory cell connected to an a-th first line (a=an integer of 1 to Na) and a b-th second line (b=an integer of 1 to Nb) in an m-th one of the MATs (m=an integer of 1 to Nm) has a logical address $i=\{(a-1)Nb+(b-1)\}Nm+(m-1)$, the plurality of access circuits simultaneously access a j-th page (j=an integer of 1 to Na×Nb) composed of Nm memory cells at logical addresses Nm (j−1) through Nm (j−1)+(Nm−1).

Effect of the Invention

In accordance with the present invention, it is made possible to provide a nonvolatile memory capable of realizing fast operation by concurrent write/erase to plural memory cells and relieving the influence by heat produced from memory cells at the time of operation.

BEST MODE FOR CARRYING OUT THE INVENTION

The embodiments associated with the nonvolatile memory according to the present invention will now be described in detail with reference to the drawings.

[First Embodiment]

Figure 1:
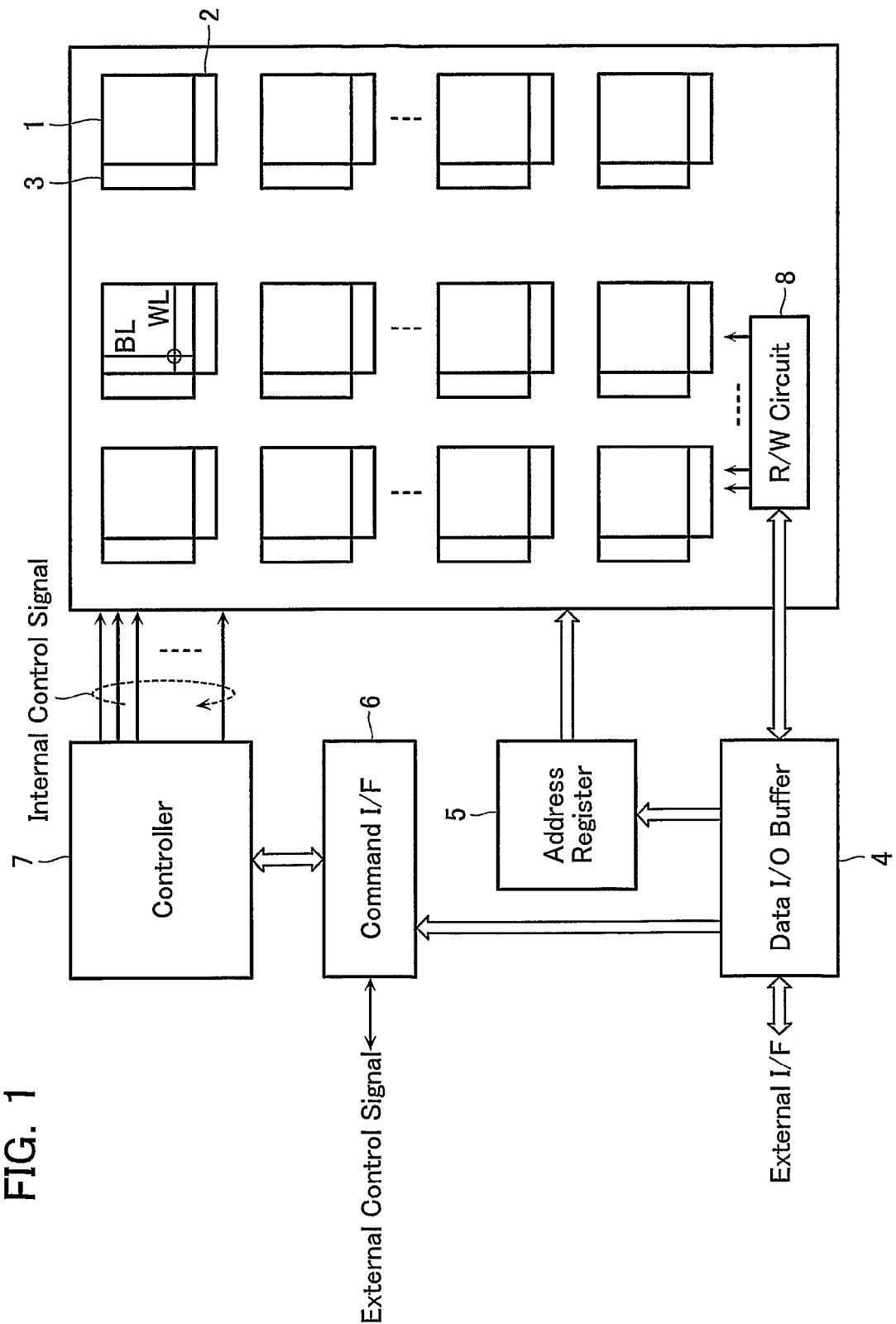
FIG. 1 is a block diagram of a nonvolatile memory according to a first embodiment of the present invention.

FIG. 1 is a block diagram of a nonvolatile memory according to a first embodiment of the present invention.

The nonvolatile memory comprises a plurality of MATs (unit cell arrays) 1 arranged in matrix, each including memory cells using resistance variable elements, as in a later-described ReRAM (Resistive RAM). Each MAT 1 includes an access circuit, that is, a column control circuit 2 and a row control circuit 3. The column control circuit 2 includes a sense amplifier circuit (not shown) operative to sense/amplify data appeared on a bit line from a memory cell. It controls bit lines BL in the MAT 1 and executes erasing data from the memory cells, writing data to the memory cells, and reading data out of the memory cells. The row control circuit 3 is operative to select from among word lines WL in the MAT 1 and apply voltages required for erasing data from the memory cells, writing data to the memory cells, and reading data out of the memory cells.

A data I/O buffer 4 is connected to an external host, not shown, via an I/O line to receive write data, receive an erase instruction, provide read data, and receive address data and command data.

The data I/O buffer 4 is connected to a read/write circuit (hereinafter referred to as "R/W circuit") 8. The data I/O buffer 4 sends received write data via the R/W circuit 8 to the column control circuit 2 and receives read-out data from the column control circuit 2 via the R/W circuit 8 and provides it to external. An address fed from external to the data I/O buffer 4 is sent via an address register 5 to the column control circuit 2 and the row control circuit 3. A command fed from the host to the data I/O buffer 4 is sent to a command interface 6. The command interface 6 receives an external control signal from the host and decides whether the data fed to the data I/O buffer 4 is write data, a command or an address. If it is a command, then the command interface transfers it as a received command signal to a controller 7. The controller 7 manages the entire nonvolatile memory and receives commands from the host to execute read, write, erase, and data I/O management. The external host can also receive status information managed by the controller 7 and decide the operation result. The status information is also utilized in control of write and erase.

The controller 7 controls the R/W circuit 8. Under this control, the R/W circuit 8 is allowed to provide a pulse of any voltage/current at any timing. The pulse formed herein can be transferred to any line selected by the column control circuit 2 and the row control circuit 3.

As shown in the figure, the column control circuit 2, the row control circuit 3 and the R/W circuit 8 are formed coplanar with the MAT 1 though these peripheral circuit elements other than the MATs 1 can be formed in the Si substrate immediately beneath the MATs 1 formed in a wiring layer. Thus, the chip area of the nonvolatile memory can be made almost equal to a total area of plural MATs 1.

Figure 2:
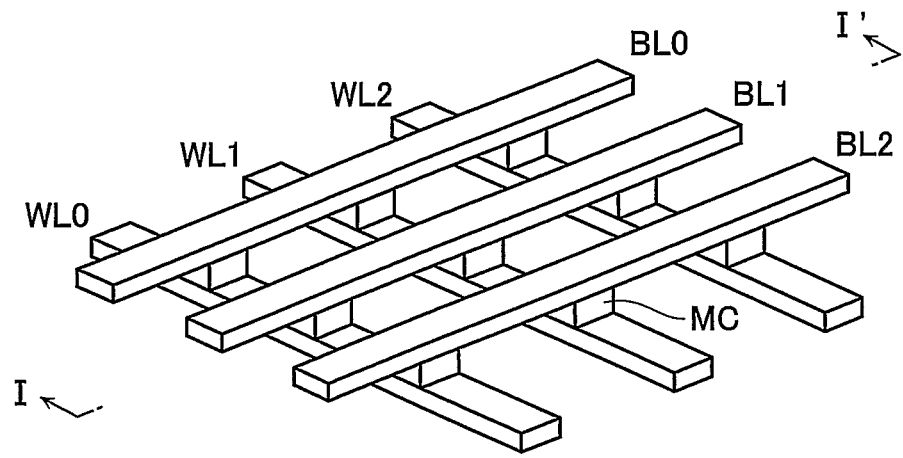
FIG. 2 is a perspective view showing part of a MAT in the nonvolatile memory according to the same embodiment.
Figure 3:
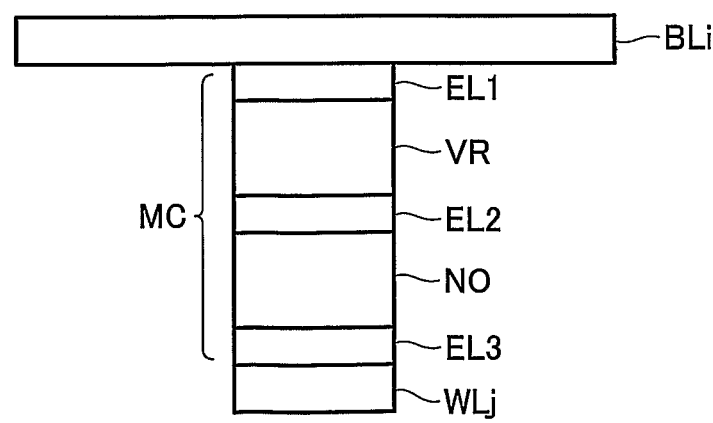
FIG. 3 is a cross-sectional view of one memory cell taken along I-I' line and seen from the direction of the arrow in FIG. 2.

FIG. 2 is a perspective view of part of the MAT 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistive element VR and a non-ohmic element NO as shown in FIG. 3.

The variable resistive element VR can vary the resistance with current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrO$_x$, PtRhO$_x$, Rh, TaAlN. A metal film capable of achieving uniform orientation may also be interposed. A buffer layer, a barrier metal layer and an adhesive layer may further be interposed.

Available examples of the variable resistive element VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) although there is no agreed theory (the factors in the resistance variation are roughly divided into two: one that causes a variation in resistance in accordance with the presence/absence of charge trapped in charge traps present in the electrode interface; and one that causes a variation in resistance in accordance with the presence/absence of the conduction path due to an oxygen loss and so forth).

Figure 4:
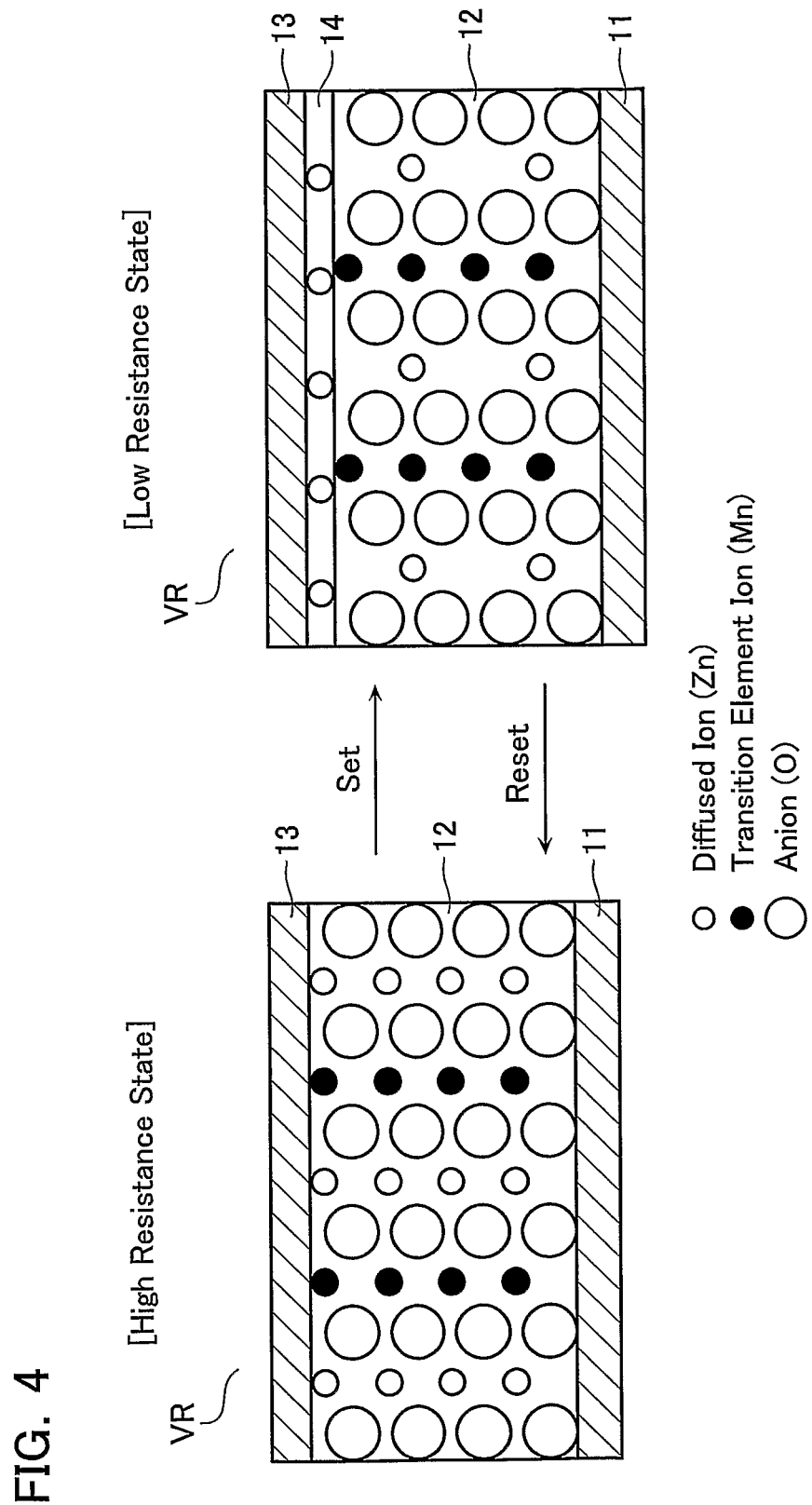
FIG. 4 is a schematic cross-sectional view showing an example of a variable resistive element in the same embodiment.

FIG. 4 shows an example of the ReRAM. The variable resistive element VR shown in FIG. 4 includes a recording layer 12 arranged between electrode layers 11, 13. The recording layer 12 is composed of a composite compound containing at least two types of cation elements. At least one of the cation elements is a transition element, of which d-orbit is incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$) an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and the electrode layer 13 is supplied with a negative voltage, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for a sufficient time for Joule heating, thereby facilitating the oxidation reduction reaction in the recording layer 12. Application of an electric field in the opposite direction from that at the time of setting may also allow resetting.

The non-ohmic element NO may include various diodes such as a Schottky diode, a PN-junction diode, a PIN diode, and may have a MIM (Metal-Insulator-Metal) structure, and a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistive element VR may be placed in the opposite relation to that in FIG. 3. The non-ohmic element NO may be reversed in polarity.

Operation of the present embodiment is described next.

Figure 5:
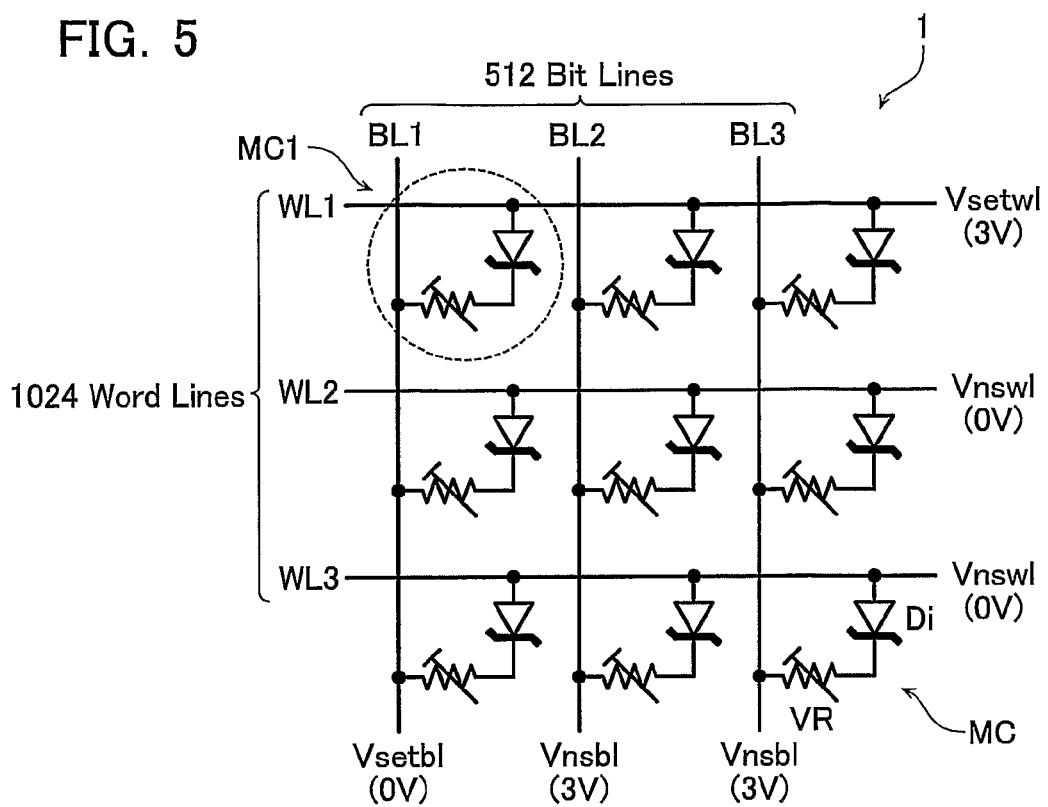
FIG. 5 is a circuit diagram showing a MAT at the time of writing.

FIG. 5 is a circuit diagram showing the MAT 1 at the time of writing (setting) in the nonvolatile memory.

The MAT 1 includes, for example, 1024 first lines or word lines WL and, for example, 512 second lines or bit lines BL crossing these word lines WL. There are 1024×512 intersections of the lines, at which connected are memory cells MC each including the non-ohmic element NO or a diode D1 having an anode connected to the word line WL, and the variable resistive element VR connected between the cathode of the diode D1 and the bit line BL. The size of the MAT 1 can be determined in consideration of voltage drops on the word line WL and the bit line BL, CR delays, processing speeds of data writing, and so forth. It may have an arbitrarily selected size such as 1024×2048 other than the MAT 1 shown in FIG. 5.

Subsequently, writing to the MAT 1 is described. The following description is given to writing to the memory cell MC1 connected at the intersection of the word line WL1 and the bit line BL1, surrounded by the dotted line in FIG. 5.

In this case, the word line WL1 connected to the memory cell MC1 is supplied with a word line set voltage Vsetw1 (3 V, for example), and the bit line BL1 is supplied with a bit line set voltage Vsetbl (0 V, for example). As a result, in the memory cell MC1, the diode D1 is forward biased and accordingly the variable resistive element VR makes a transition to the low-resistance state to complete writing.

On the other hand, the word lines WL2, . . . connected to other memory cells MC are supplied with a word line non-selection voltage Vnswl (0 V, for example) and the bit lines BL2, . . . are supplied with a bit line non-selection voltage Vnsbl (3 V, for example). As a result, in the memory cells MC, the diode D1 is reverse biased and the variable resistive element VR makes no transition in the resistance state because no current flows therein.

Writing is described above while erasing (resetting) is similar to writing except that a lower reset voltage than the set voltage is applied for a longer period of time than that for the set voltage to produce Joule heat from the memory cells MC.

Thus, in writing only to one memory cell MC1, other memory cells MC produce no heat and accordingly heat produced from the entire cell array influences less and causes no problem. In this case, though, the memory cells MC are subjected one by one to writing. Accordingly, complete of writing to all the memory cells contained in the cell array takes a considerable length of time.

A method of solving the above problem comprises writing to a plurality of memory cells MC simultaneously as considered. Hereinafter, the plurality of memory cells MC simultaneously accessed is referred to as a page.

Figure 6:
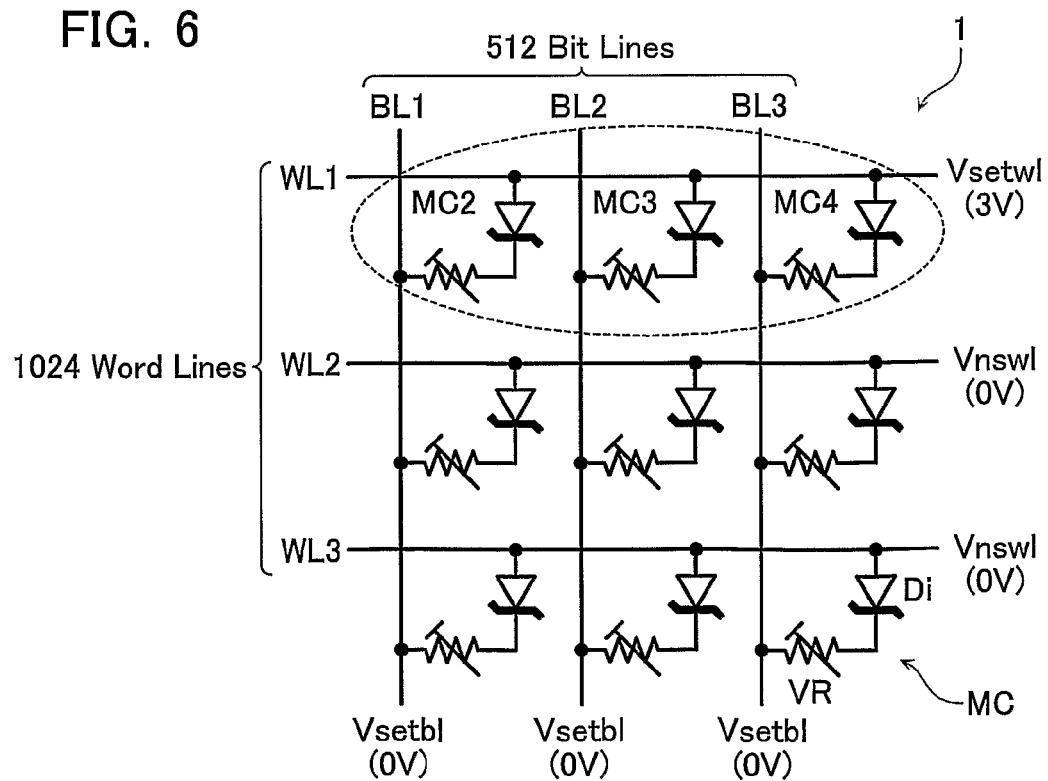
FIG. 6 is a circuit diagram showing a MAT at the time of writing on a page basis.

FIG. 6 is a circuit diagram showing the MAT 1 at the time of writing on a page basis. The following description is given to the case for simultaneously writing to the memory cells MC2-MC4 connected to the word line WL1, surrounded by dotted line in FIG. 6.

In this case, the word line WL1 is supplied with a word line set voltage Vsetw1 (3 V). On the other hand, the bit lines BL1-BL3 connected to the memory cells MC2-MC4 are supplied with a bit line set voltage Vsetbl, that is, 0 V. As a result, in the memory cells MC2-MC4 connected at the intersections of the word line WL1 and the bit lines BL1-BL3, the diode D1 is forward biased and accordingly the variable resistive element VR in the memory cells MC2-MC4 makes a transition to the low-resistance state to execute writing on a page basis. On the other hand, in the memory cells MC connected to non-selected word lines WL2, WL3, the diode D1 is not forward biased, and the variable resistive element VR in the memory cells MC allows no current to flow therein, and makes no transition in the resistance state.

Writing is described above while erasing is similar to writing except that a lower reset voltage than the set voltage is applied for a longer period of time than that for the set voltage to produce Joule heat from the memory cells MC.

Thus, in writing to plural memory cells MC connected to the word line WL1, simultaneous writing can be executed. Accordingly, it is possible to execute write processing faster than one-by-one writing.

In this case, however, plural adjacent memory cells MC produce heat simultaneously. Therefore, the influence from adjacent memory cells and the influence by heat produced from the entire cell array are large and may result in the loss of the stability of the nonvolatile memory.

Subsequently, writing to the entire cell array on a page basis is described.

Figure 7:
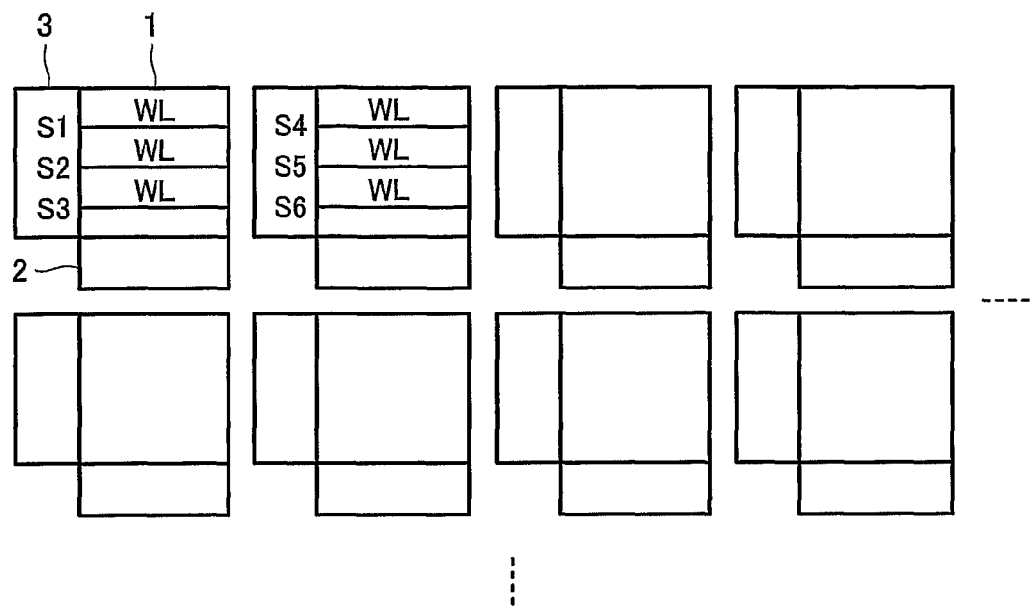
FIG. 7 is a brief diagram showing an example of writing sequence on a page basis.
Figure 8:
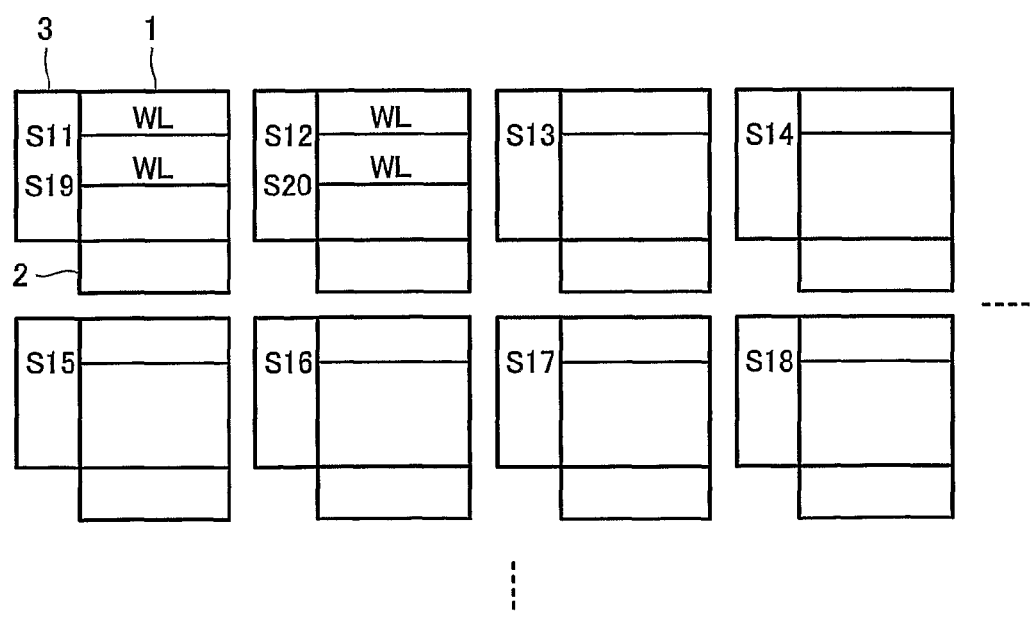
FIG. 8 is a brief diagram showing another example of writing sequence on a page basis.

FIGS. 7 and 8 are brief diagrams showing examples of writing sequence on a page basis.

FIG. 7 shows the case where sequential writing is executed to pages in the same MAT 1 and, after completion of writing to pages contained in the MAT 1 (S1-S3), sequential writing is executed to pages in the next MAT 1 (S4-S6).

In this case, because of writing on a page basis, heat simultaneously produced from plural memory cells MC largely influences. In addition, because of continuous writing to adjacent pages in a shorter time, the quantity of residual heat largely influences and may extremely deteriorate the stability around the page during writing.

FIG. 8 shows sequential writing to each MAT 1 page by page (S11-S18) and then writing to a different not-written page in each MAT 1 again (S19-). Through the repetition of writing on a page basis, writing can be executed to the entire cell array.

In this case, after writing to one page belonging to a certain MAT, writing is executed to one page belonging to a different MAT physically separated therefrom. Accordingly, compared with the case of FIG. 7, the page during writing is hardly susceptible to heat produced by writing to other pages and therefore the stability can be improved. Even in this case, however, with regard to writing to individual pages, plural physically proximate memory cells MC connected to one word line WL produce heat at the same time unchangeably. Therefore, it is not sufficient to improve the stability of the nonvolatile memory.

Figure 9:
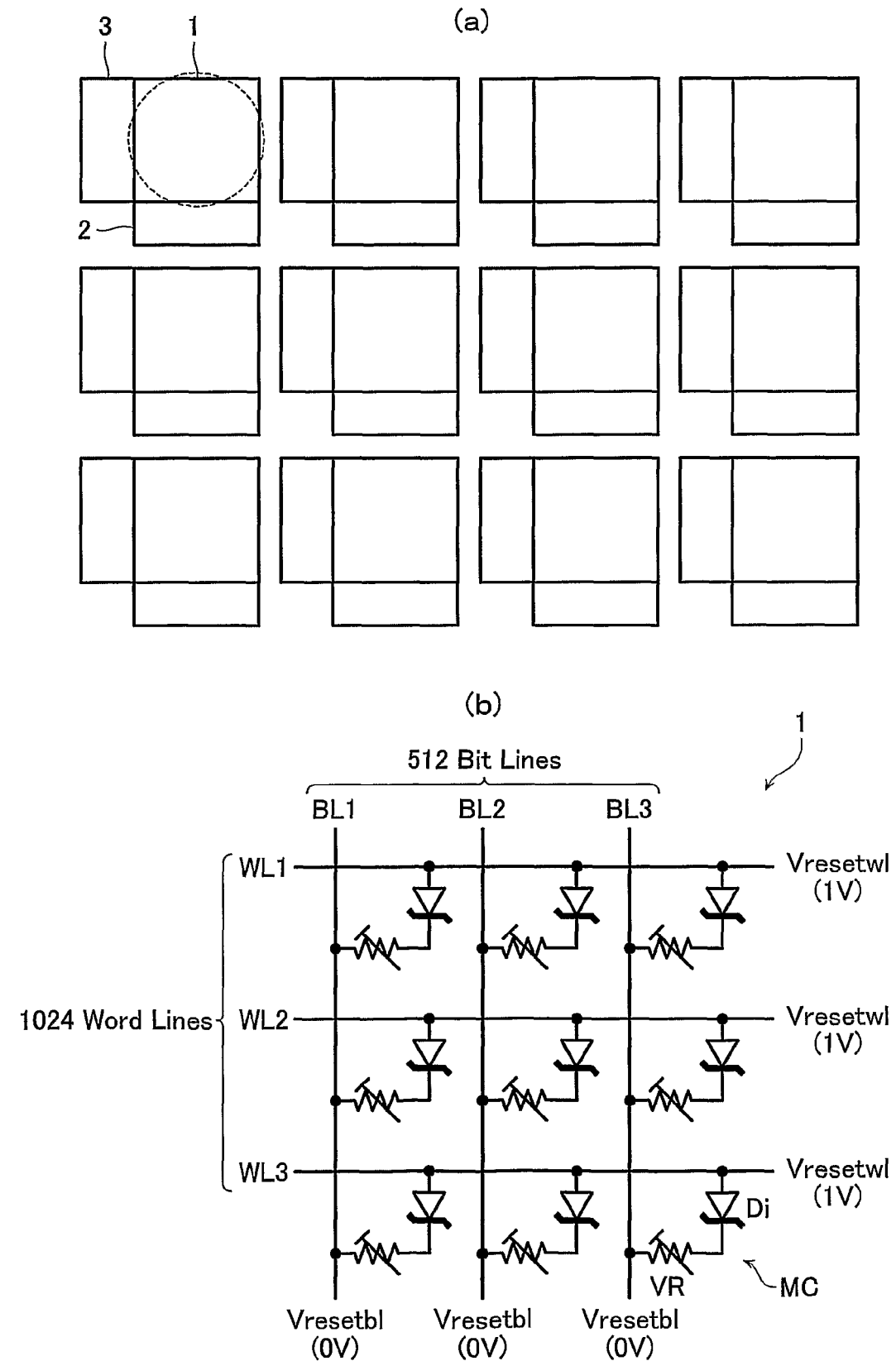
FIG. 9 provides a brief diagram (a) showing erasing on a MAT basis and a circuit diagram (b) showing a MAT.

As for erasing, it is possible to execute batch erasing on a MAT 1 basis as can be considered. The following description is given to erasing executed to a MAT 1 surrounded by the dotted line in FIG. 9(a). FIG. 9(b) is a circuit diagram showing the MAT 1 surrounded by the dotted line in FIG. 9(a).

In this case, as in FIG. 9(b), all word lines WL are supplied with a word line reset voltage Vresetwl (1 V, for example) lower than a word line set voltage Vsetwl (3 V, for example). In addition, all bit lines BL are supplied with a bit line reset voltage Vresetbl (0 V, for example). As a result, in all memory cells MC, the diode D1 is forward biased and the resistance state of the variable resistive element VR makes a transition to the high-resistance state to complete erasing.

Thus, erasing on a MAT 1 basis makes it possible to execute erase processing faster than erasing executed to the memory cells MC one by one or page by page, In this case, however, a number of memory cells MC adjacent to each other along the word line WL or along the bit line BL produce heat simultaneously. Therefore, the instability of the nonvolatile memory is increased obviously more than erasing executed to the memory cells MC one by one or page by page.

Figure 10:
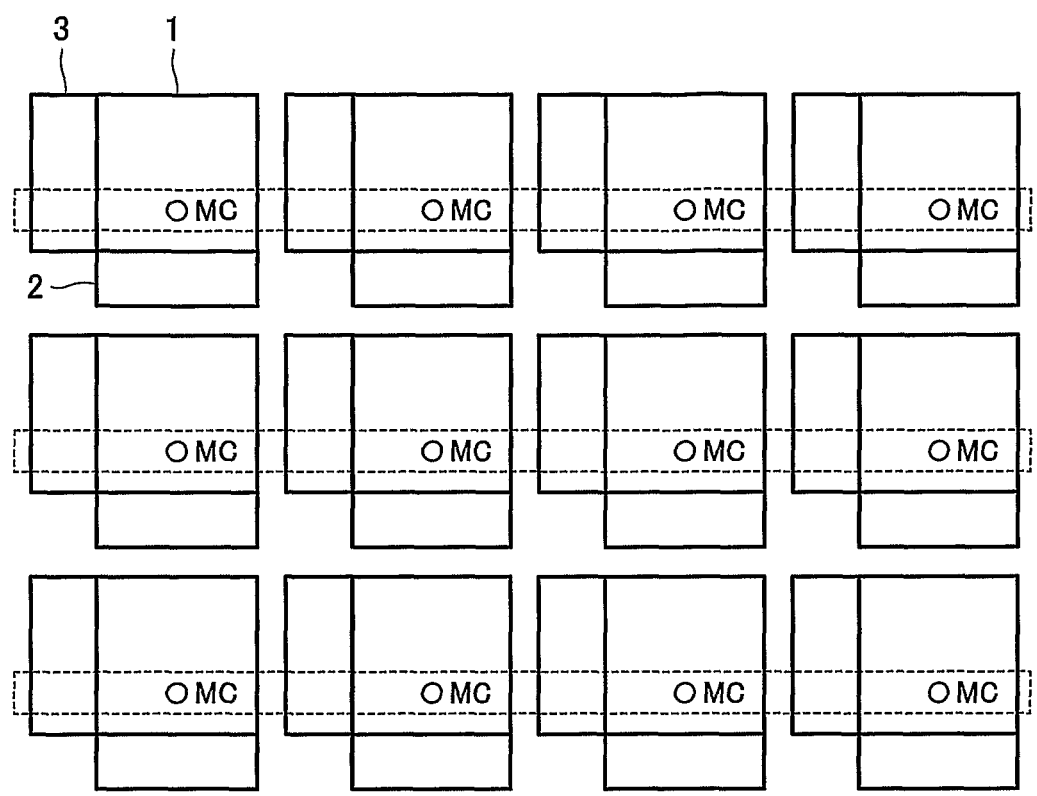
FIG. 10 is a brief diagram showing writing on a page basis in the nonvolatile memory according to the first embodiment.

Then, in the present embodiment, memory cells MC are selected one by one from plural MATs 1 as shown in FIG. 10, and the selected memory cells MC are subjected to batch erasing.

Thus, even in writing/erasing to a page surrounded by the dotted line in FIG. 10, because the memory cells MC are separated from each other, the heat produced from each memory cell MC can be relieved to influence on other memory cells MC. In addition, because of operation on a page basis, the processing time is not inferior to the operation on a page basis shown in FIGS. 6 and 7.

A specific configuration of the present embodiment is described below.

Figure 11:
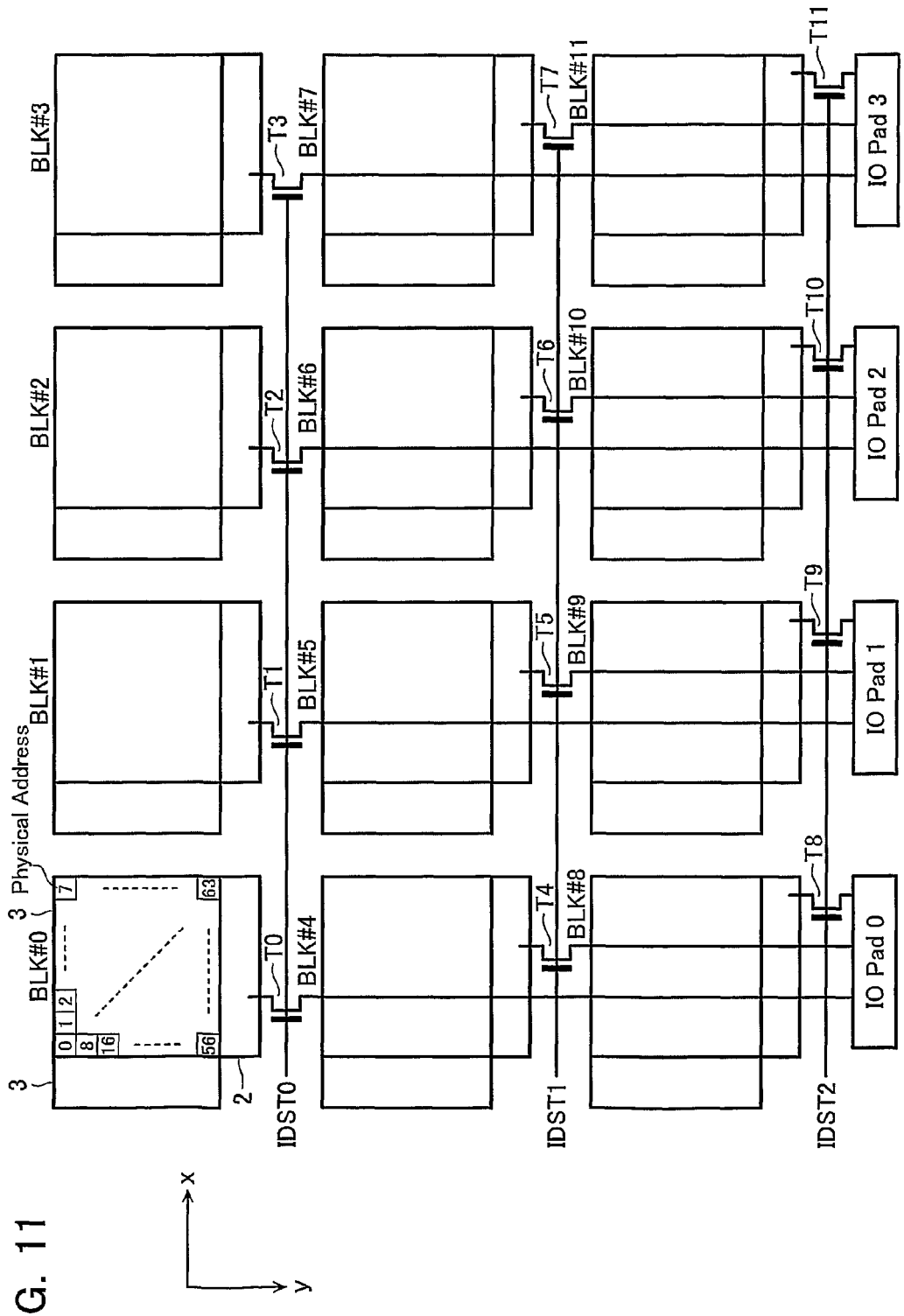
FIG. 11 is a block diagram showing a cell array in the same embodiment.

FIG. 11 is a block diagram of the cell array in the first embodiment.

The cell array in FIG. 11 is divided into 4 rows along the extension of the word line WL or in the x direction and 3 columns along the extension of the bit line BL or in the y direction, thus 12 blocks BLK in total. The following description is given on the assumption that the blocks located on the upper stage in FIG. 11 are denoted with BLK#0, #1, #2, #3 from the left, the blocks located on the middle stage with BLK#4, #5, #6, #7 from the left, and the blocks located on the lower stage with BLK#8, #9, #10, #11.

Each block BLK includes a respective MAT. Each MAT is assumed to have 8 memory cells in the x direction and 8 memory cells in the y direction, thus 64 in total for simplicity of description. Memory cells in the MAT are assigned with physical addresses, which increase one by one in the x direction and 8 by 8 in the y direction. In a word, memory cells at the upper left corner, the upper right corner, the lower left corner, and the lower right corner in each MAT are assigned with physical addresses 0, 7, 56, 73.

Each MAT is provided with a column control circuit 2 and a row control circuit 3.

The column control circuits 2 in the MATs located in the blocks BLK#0, #4, #8 aligned in the y direction are connected via transfer transistors T0, T4, T8 to an IO pad 0. Similarly, the column control circuits 2 in the MATs located in the blocks BLK#1, #5, #9 are connected via transfer transistors T1, T5, T9 to an IO pad 1, the column control circuits 2 in the MATs located in the blocks BLK#2, #6, #10 are connected via transfer transistors T2, T6, T10 to an IO pad 2, and the column control circuits 2 in the MATs located in the blocks BL#3, #7, #11 are connected via transfer transistors T3, T7, T11 to an ID pad 3, respectively. The transfer transistors T0-T3 aligned in the x direction have respective gates, which are supplied with a common input data selection signal IDST0. Similarly, the transfer transistors T4-T7 and T8-T11 have respective gates, which are supplied with common input data selection signals IDST1 and IDST2, respectively. The input data selection signals IDST0-2 are signals determined on the basis of input addresses.

The following description is given to assignment of logical addresses to the cell array configured above.

Figure 12:
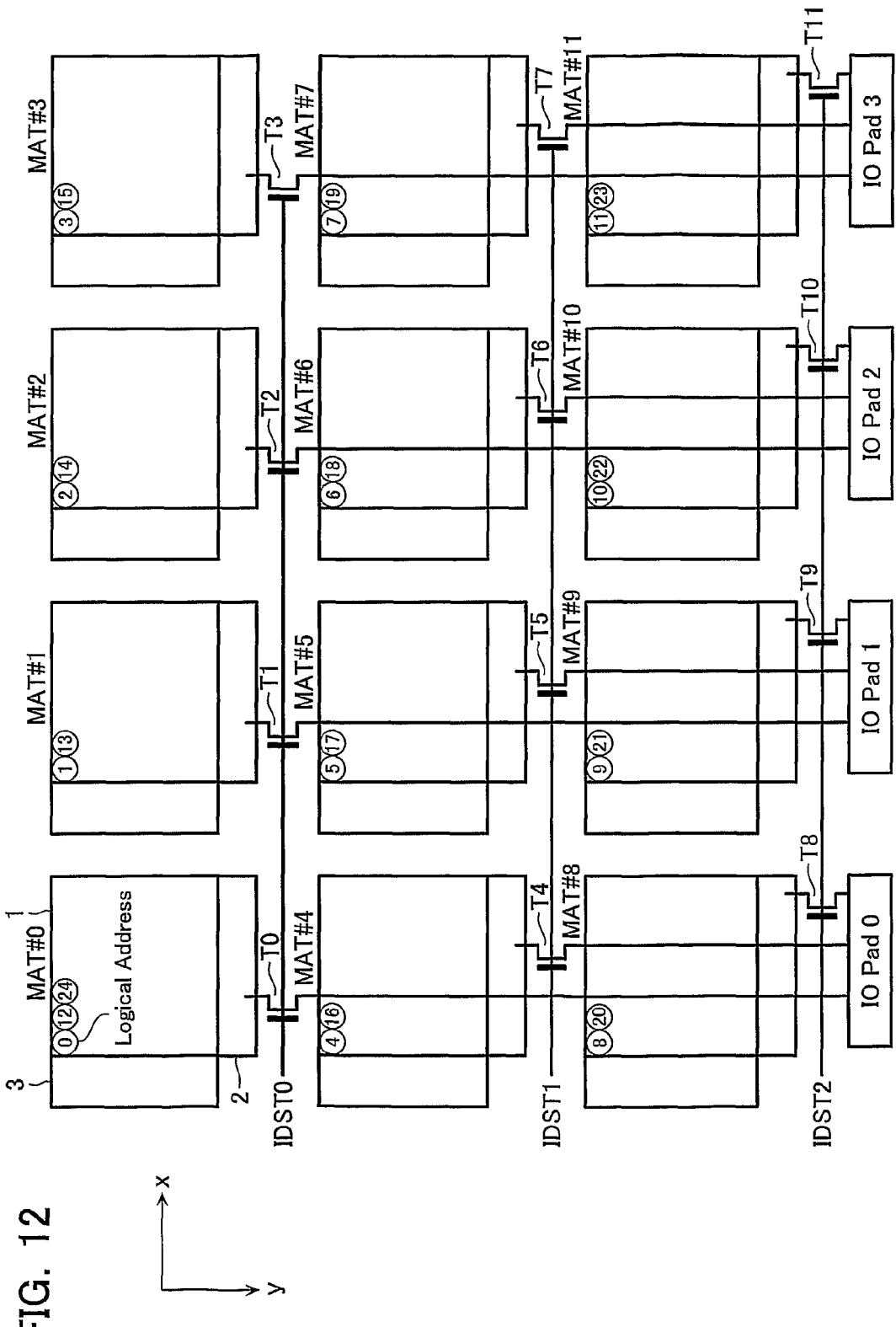
FIG. 12 is a block diagram showing an arrangement of MATs and logical addresses of memory cells in the cell array in the same embodiment.

FIG. 12 is a block diagram showing an arrangement of MATs and logical addresses of memory cells in the cell array in the present embodiment.

The MAT#0-#11 are arranged in the blocks BLK#0-#11 shown in FIG. 11, respectively.

If each memory cell has a physical address i (i=0, 1, ... ), a logical address of each memory cell in MATm is assigned with M+12×i as shown in FIG. 12.

The following description is given to writing on a page basis to the cell array assigned with logical addresses in this way. In this case, one page contains 12 memory cells, and a j-th page (j=1, 2, ... ) is composed of memory cells at logical addresses (j−1)×12 through (j−1)×12+11. For example, the 2nd page is composed of memory cells at logical addresses #12-#23.

In general, in the case where the number of MATs is Nm (Nm=an integer of 1 or more), the number of word lines WL in each MAT is Na (Na=an integer of 1 or more), and the number of bit lines BL is Nb (Nb=an integer of 1 or more), a memory cell connected to an a-th word line WL (a=an integer of 1 to Na) and a b-th bit line BL (b=an integer of 1 to Nb) has a logical address i, which can be represented by {(a−1)Nb+ (b−1)}Nm+(m−1). In this case, a j-th page (j is an integer of 1 to Na×Nb) includes Nm memory cells at logical addresses Nm(j−1) through Nm(j−1)+(Nm−1).

Initially, input data fed from external is transferred to the column control circuit 2 contained in each MAT 1 via the IO pad. The configuration of FIG. 12 includes 4 IO pads. Accordingly, when input data is transferred to the column control circuits 2 contained in all the 12 MATs, the input data is divided into 3 pieces, which are then transferred at different times. Specifically, first 4 bits of the input data are prepared on the pads 0-3. Thereafter, the input data selection signal IDST0 is activated ("H") to turn on the transfer transistors T0-T3 to connect the IO pads 0-3 with the column control circuits 2 in the MAT#0-#3. Thus, the input data bits on the IO pads 0-3 are transferred to the column control circuits 2 in the MAT#0-#3. Subsequently, next 4 bits of the input data are prepared on the pads 0-3. Thereafter, the input data selection signal IDST1 is activated ("H") to turn on the transfer transistors T4-T7 to connect the IO pads 0-3 with the column control circuits 2 in the MAT#4-07. Thus, the input data bits on the IO pads 0-3 are transferred to the column control circuits 2 in the MAT#4-#7. Similarly, subsequent 4 bits of the input data are transferred to the column control circuits 2 in the MAT#8-#11. Thus, one bit of the input data can be prepared in the column control circuits 2 in all the MAT#0-#11. The input data selection signals IDST0-2 are herein controlled such that they are activated sequentially at operation cycles.

In this state, simultaneously in the MATs, the word line WL connected to the memory cell at a physical address #0 is supplied with a word line set voltage Vsetwl (3 V), and the bit line BL is supplied with a bit line set voltage Vsetbl (3 V or 0 V). On the other hand, the word lines WL connected to other memory cells are supplied with a word line non-selection voltage Vnswl (0 V), and the bit lines BL are supplied with a bit line non-selection voltage Vsetbl (3 V). As a result, the input data at the column control circuits in the MATs is held in the memory cell at the physical address #0 to complete the 1st page writing.

With repetitions of the above over all the pages, writing to the entire cell array can be completed.

In accordance with the configuration of FIG. 11, 12 bits of one page input data are divided and transferred to the column control circuits in the MATs. A preparation of more IO pads than those in the above example decreases the number of transfers. For example, if there are 12 IO pads, one page data can be prepared with one transfer. On the other hand, if there are fewer IO pads, an increased number of transfers can respond to such the case.

The following description is given to operation of the row control circuit 3 for realizing such write.

Figure 13:
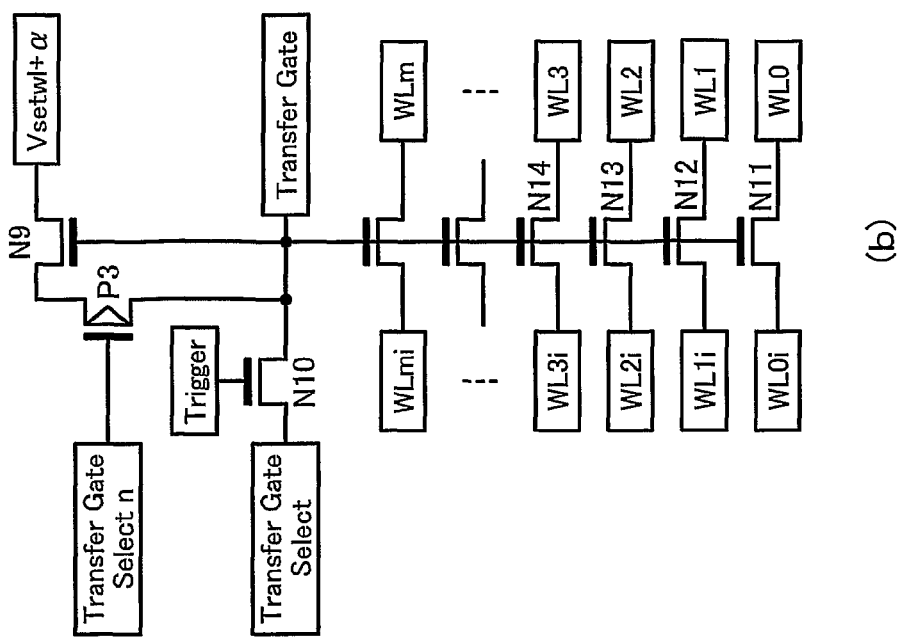
FIG. 13 is a circuit diagram showing part of a row control circuit in the same embodiment.
Figure 13:
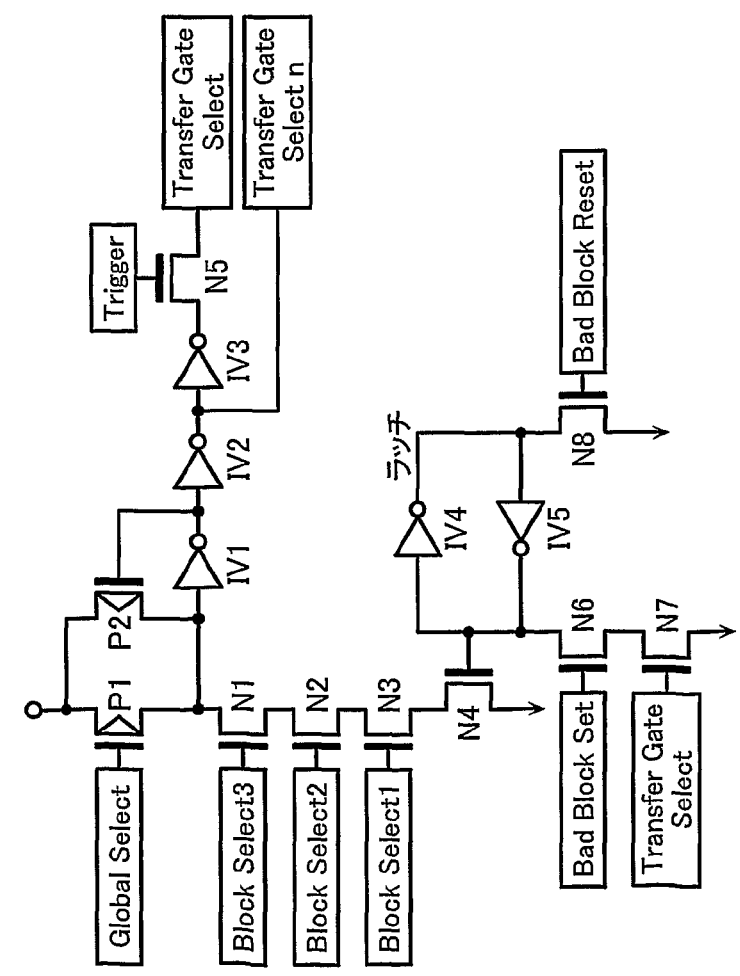

FIG. 13 is a circuit diagram showing part of the row control circuit 3.

The row control circuit 3 in each MAT 1 is supplied with an address for selecting the MAT via a global word line (Global Select) and local address lines (Block Select 1-3) arranged for reducing the number of address lines, and with an address for selecting a word line in the MAT via local address lines, not shown. As shown in FIG. 13(a), the global word line (Global Select) and the local address lines (Block Select 1-3) are used to activate transistors P1 and N1-N3 to select the MAT. The row control circuit 3 comprises inverters IV4, IV5 that are set or reset in accordance with whether each MAT is a failed block or not, and a latch circuit including transistors N6, N8, thereby isolating the failed block therefrom. When the transistors P1 and N1-N4 turn on, a transistor P2 turns on. As a result, a transfer gate select n signal rises via inverters IV1, IV2 and a transfer gate select signal falls in sync with a trigger signal via an inverter IV3 and a transistor N5.

On receipt of these transfer gate select signal and select n signal, as shown in FIG. 13(b), a set voltage, Vsetwl+α, is supplied to a transfer gate, not shown, via transistors N9 and P3. In addition, word line selection signals obtained by decoding the local address are used to on/off control the transfer gate, not shown, via transistors N11-N14 of which gates are specially controlled via the transistor N10. Thus, the set voltage, Vsetwl+α, is transferred to the selected word line WL in the selected MAT.

Among these circuits, internal logics may be configured to select plural MATs at the same time with the global word line and the local address lines.

Thus, the present embodiment makes it possible to execute simultaneous writing to plural memory cells contained in plural pages and accordingly reduce the time required for writing shorter than writing to the memory cells one by one. Further, simultaneous write target memory cells are dispersed in different MATs and physically separated from each other. Accordingly, it is possible to provide a high-stability nonvolatile memory capable of exerting less influence by heat produced from memory cells, similar to writing to the memory cells one by one.

[Second Embodiment]

Figure 14:
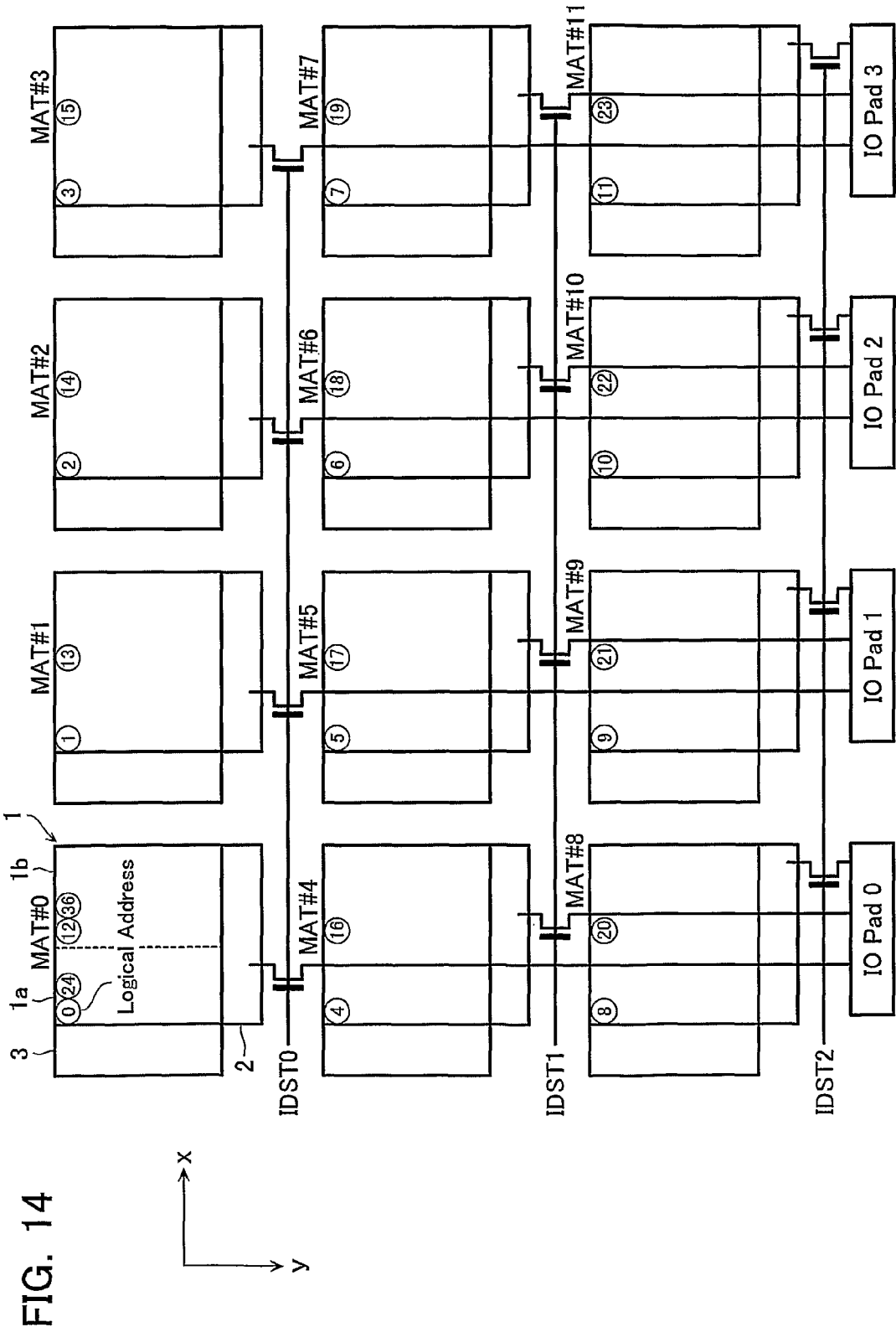
FIG. 14 is a block diagram showing an arrangement of MATs and logical addresses of memory cells in a cell array in a nonvolatile memory according to a second embodiment.

FIG. 14 is a block diagram showing an arrangement of MATs and logical addresses of memory cells in a cell array in a nonvolatile memory according to a second embodiment.

The assignment sequence of logical addresses belonging to the MATs is changed from that in the first embodiment.

The logical addresses to be assigned to the memory cells belonging to the MATs are assigned with a difference of 12, like in the case of the first embodiment. In the case of the present embodiment, however, each MAT is logically divided into two in the x direction, and thus in MATn, a memory cell at a physical address #0 is assigned with a logical address n; a memory cell at a physical address #4 is assigned with a logical address n+12; a memory cell at a physical address #2 is assigned with a logical address n+24; and a memory cell at a physical address #5 is assigned with a logical address n+36. Thus, in the present embodiment, logical addresses are assigned alternately to a left portion 1a and a right portion 1b in a MAT.

In this case, the memory cells at logical addresses #0-#11 contained in the 1st page and the memory cells at logical addresses #12-#23 contained in the 2nd page in the same MAT are arranged at a certain distance from each other in the x direction.

In a word, the present embodiment makes it possible to relieve heat produced from each of the memory cells contained in one page to influence on others. In addition, as for the positional relations, the memory cells contained in different pages are arranged at a certain distance from each other. Accordingly, heat produced from the memory cells contained in the page subjected to writing immediately before hardly influences on operation of the page during writing. With this regard, it is possible to improve the stability more than the case of the first embodiment.

[Third Embodiment]

Figure 15:
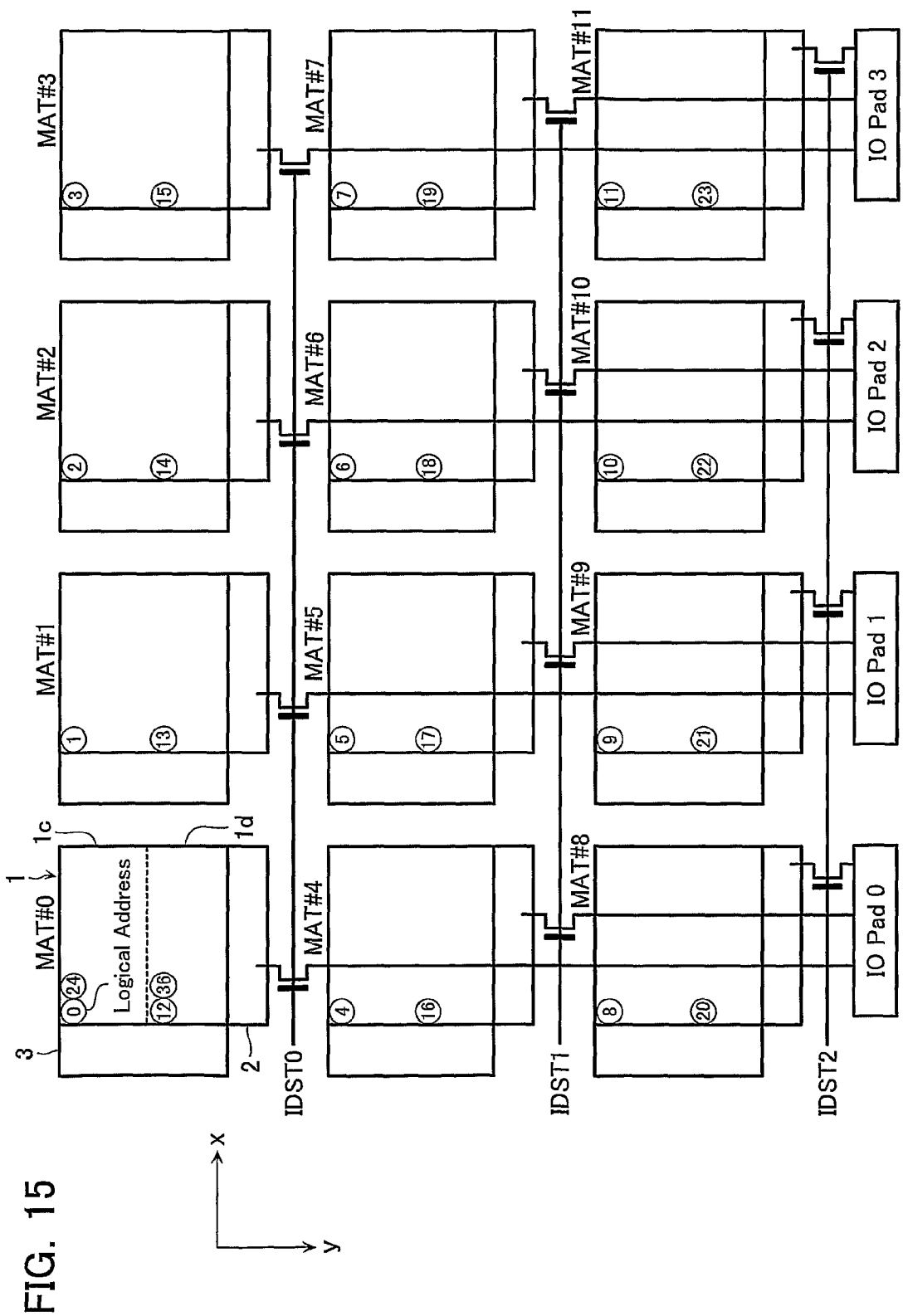
FIG. 15 is a block diagram showing an arrangement of MATs and logical addresses of memory cells in a cell array in a nonvolatile memory according to a third embodiment.

FIG. 15 is a block diagram showing an arrangement of MATs and logical addresses of memory cells in a cell array in a nonvolatile memory according to a third embodiment.

The logical addresses to be assigned to the memory cells belonging to the MATs are assigned with a difference of 12, like in the cases of the first and second embodiments. In the case of the present embodiment, each MAT is logically divided into two in the y direction, and thus in MATn, a memory cell at a physical address #0 is assigned with a logical address n; a memory cell at a physical address #32 is assigned with a logical address n+12; a memory cell at a physical address #1 is assigned with a logical address n+24; and a memory cell at a physical address #33 is assigned with a logical address n+36. Thus, in the present embodiment, logical addresses are assigned alternately to an upper portion 1c and a lower portion 1d in a MAT.

Also in the present embodiment, memory cells contained in a j-th page and a (j+1)-th page are arranged at a certain distance from each other in the y direction. Accordingly, it is possible to exert the same effect as that in the second embodiment.

[Fourth Embodiment]

Figure 16:
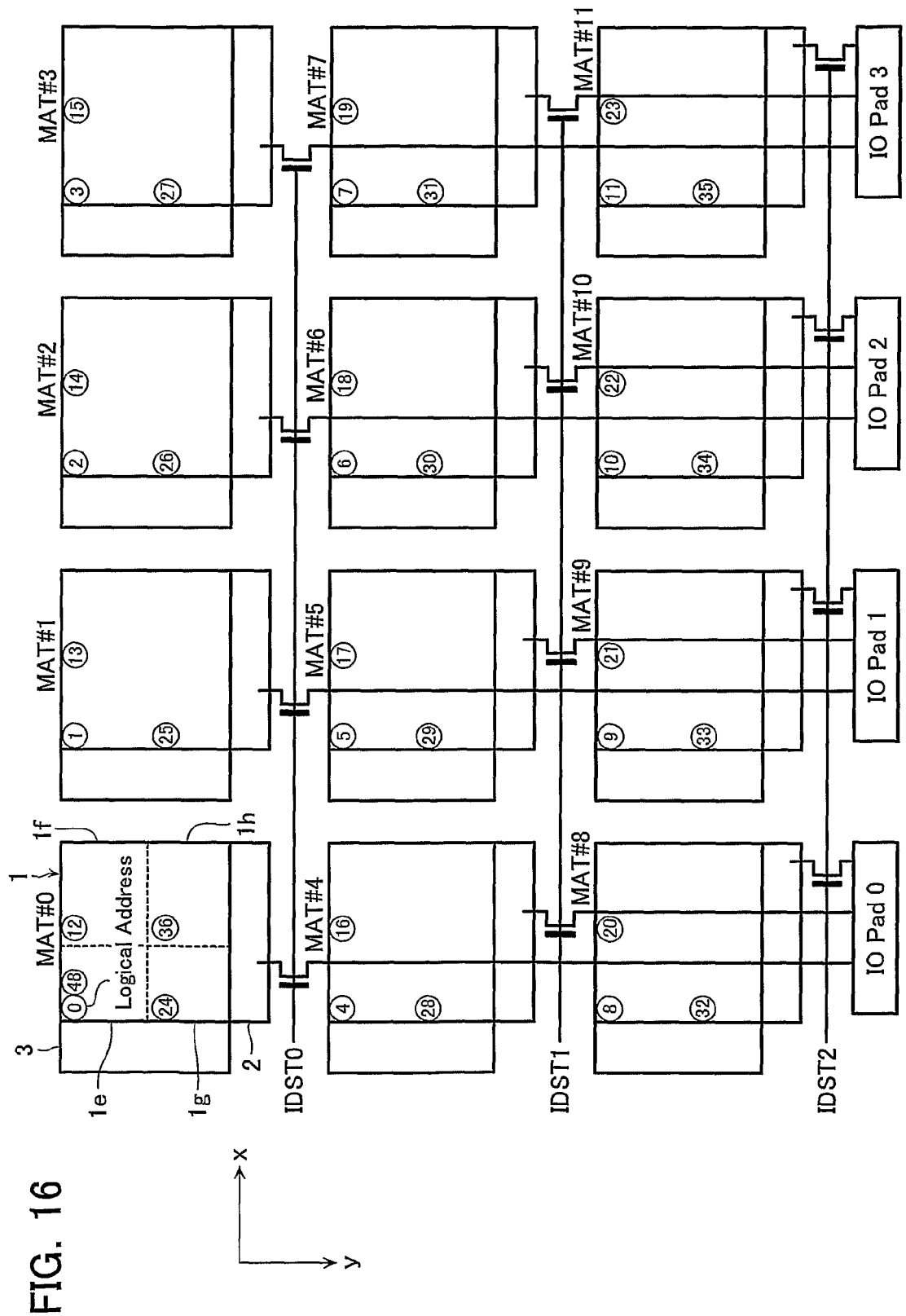
FIG. 16 is a block diagram showing an arrangement of MATs and logical addresses of memory cells in a cell array in a nonvolatile memory according to a fourth embodiment.

FIG. 16 is a block diagram showing an arrangement of MATs and logical addresses of memory cells in a cell array in a nonvolatile memory according to a fourth embodiment.

The logical addresses to be assigned to the memory cells belonging to the MATs are assigned with a difference of 12, like in the cases of the first through third embodiments. In the case of the present embodiment, each MAT is logically divided into two, both in the x direction and in the y direction, four in total, and thus in MATn, a memory cell at a physical address #0 located at the upper left portion 1e is assigned with a logical address n; a memory cell at a physical address #4 located at the upper right portion 1f is assigned with a logical address n+12; a memory cell at a physical address #32 located at the lower left portion 1g is assigned with a logical address n+24; and a memory cell at a physical address #36 located at the lower right portion 1h is assigned with a logical address n+36. Thus, in the present embodiment, logical addresses are assigned sequentially to the upper left portion 1e, the upper right portion 1f, the lower left portion 1g, and the lower right portion 1h in a MAT.

In the present embodiment, memory cells contained in j-th, (j+1)-th, (j+2)-th and (j+3)-th pages are arranged at a certain distance from each other in the x direction and in the y direction. Accordingly, it is possible to relieve the influence by writing to one page so as not to exert on others more than the first through third embodiments.

[Fifth Embodiment]

A fifth embodiment is directed to writing to a page containing 12 memory cells in two operations on a half-page basis.

Figure 17:
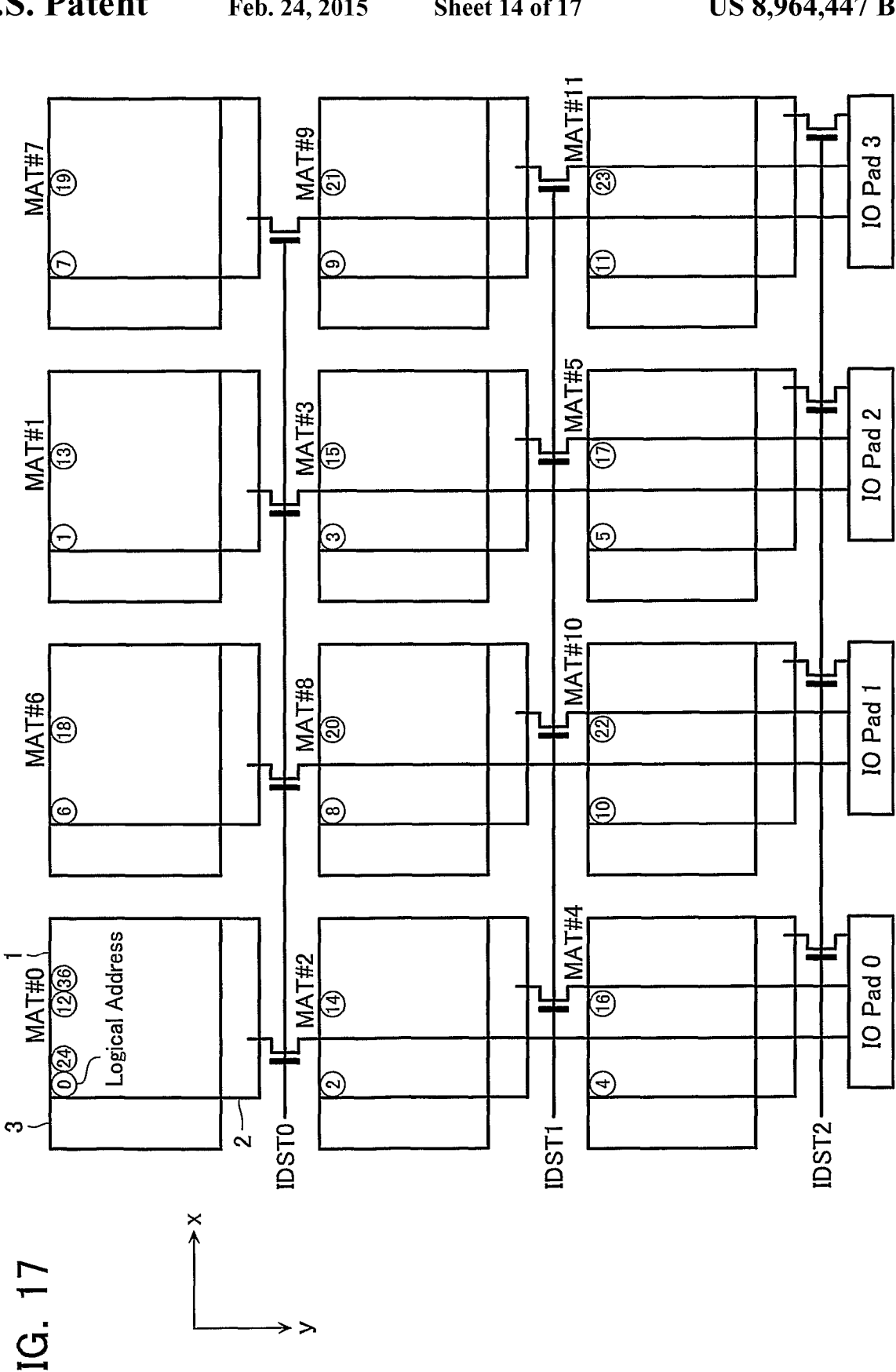
FIG. 17 is a block diagram showing an arrangement of MATs and logical addresses of memory cells in a cell array in a nonvolatile memory according to a fifth embodiment.

FIG. 17 is a block diagram showing an arrangement of MATs and logical addresses of memory cells in a cell array in a nonvolatile memory according to the fifth embodiment.

The assignment of logical addresses to memory cells in the MATs is similar to the case of the second embodiment. In the present embodiment, though, MATn and MAT (n+1) are arranged with one MAT interposed therebetween. Specifically, MAT#0-#5 are arranged in the blocks BLK#0, #2, #4, #6, #8, #10, and MAT#6-#11 in the blocks BLK#1, #3, #5, #7, #9, #11.

With this assignment of logical addresses, first, memory cells at logical addresses #0-#5 of memory cells contained in the 1st page are subjected to writing. Next, the remaining memory cells at logical addresses #6-#11 contained in the 1st page are subjected to writing. This writing in two operations executes writing to one page. Repetitions of the above can complete writing to the entire cell array.

In accordance with the present embodiment, writing to one page is divided into two. Accordingly, the write processing is made slower than those in the first through fourth embodiments though memory cells operable on first writing on a page basis are arranged with one MAT interposed therebetween in the x direction. Therefore, it is possible to relieve the influence by heat produced from memory cells lower than those in the first through fourth embodiments. Further, power consumed at a time can be reduced effectively for power consumption measures.

In the present embodiment, writing to one page is divided into two though this number may be set arbitrarily in consideration of the write processing speed, the power consumption and so forth.

[Sixth Embodiment]

Figure 18:
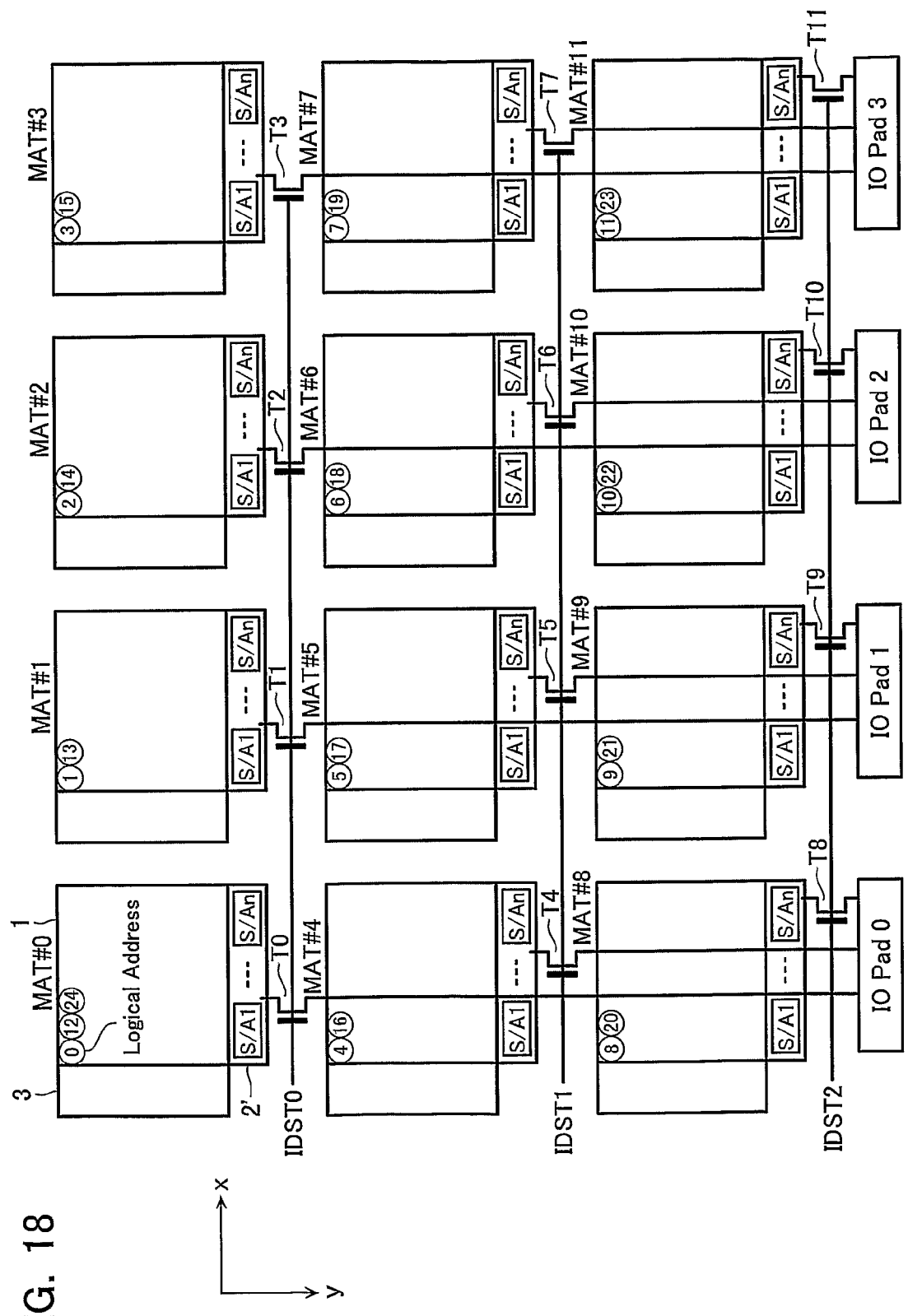
FIG. 18 is a block diagram showing an arrangement of MATs and logical addresses of memory cells in a cell array in a nonvolatile memory according to a sixth embodiment.

FIG. 18 is a block diagram showing an arrangement of MATs and logical addresses of memory cells in a cell array in a nonvolatile memory according to a sixth embodiment.

The present embodiment comprises a new column control circuit 2' in place of the column control circuit 2 in the first embodiment.

Different from the column control circuit 2, the column control circuit 2' characteristically includes plural sense amplifier circuits S/A, which allow selection of plural bit lines in each MAT. Accordingly, it is possible to execute simultaneous writing to memory cells corresponding to the sense amplifier circuits S/A in number among plural memory cells connected to the same word line.

Figure 19:
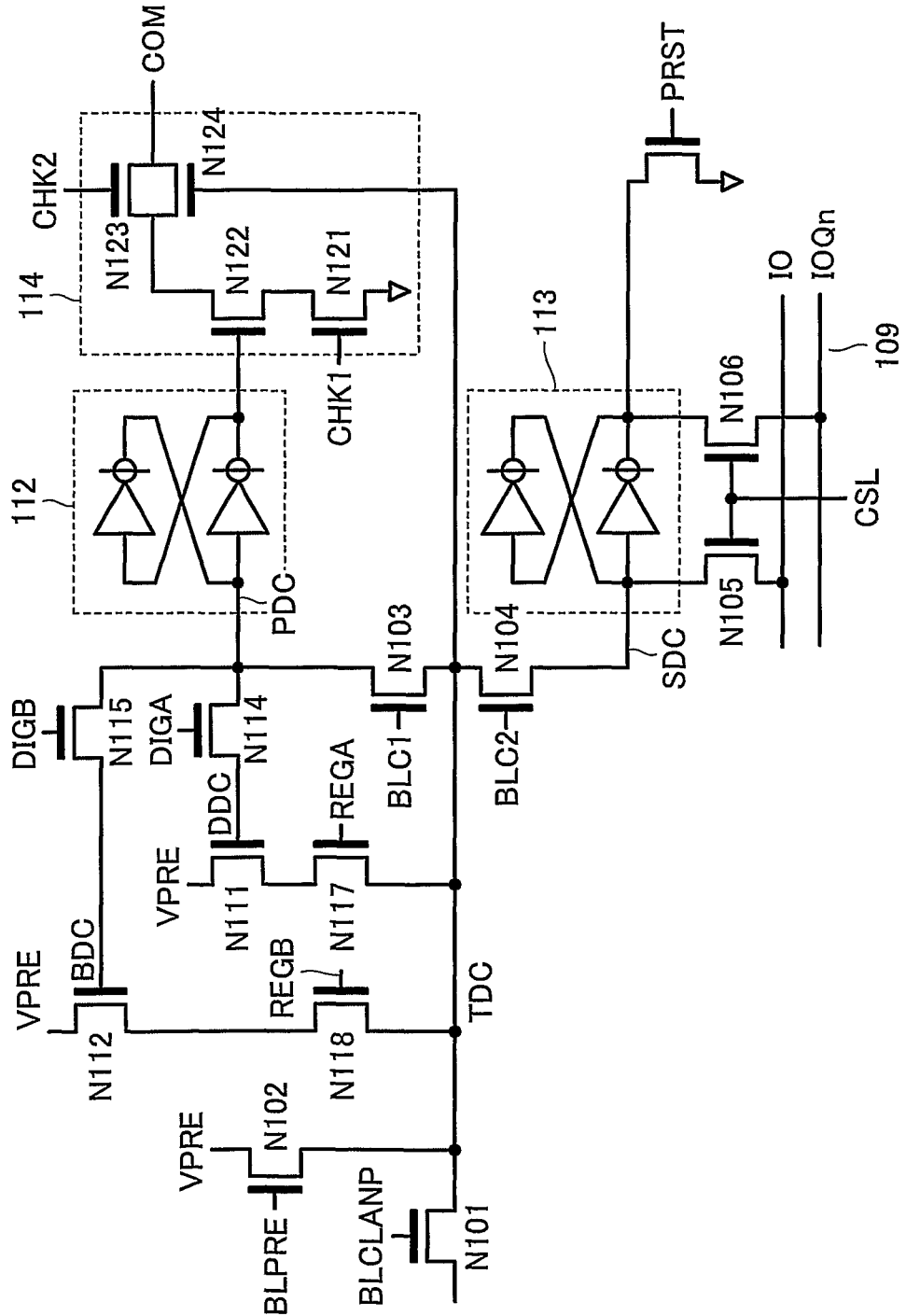
FIG. 19 is a circuit diagram of a sense amplifier circuit S/A in the same embodiment.

Subsequently, a sense amplifier circuit S/A shown in FIG. 19 is described.

A node TDC shown in FIG. 19 is a sense node for sensing the bit line voltage as well as a data storage node for temporarily storing data. The node TDC is connected via a clamp NMOS transistor N101 to the bit line BL. The clamp transistor N101 is operative to clamp the bit line voltage at the time of read and transfer it to the node TDC. The node TDC is connected to a precharge NMOS transistor N102 for precharging the bit line BL and the node TDC.

The node TDC is connected via transfer NMOS transistors N103, N104 to data storage nodes PDC, SDC in data latches 112, 113. The data latch 112 is a data storage circuit operative to hold read data and write data. The data latch 113 is a data cache arranged between the data latch 112 and data lines IO, Ion and used in temporarily storing read data or write data.

The data latch 113 has nodes, which are connected to the data line pair 10, IOn in a data bus via selection gate transistors N105, N106 driven by a column selection signal CSL.

The selection gate transistors N105, N106 are automatically turned on/off in association with the column address.

In order to obtain a certain threshold distribution, data write is executed by repeating write voltage application and write verify. Verify is executed at every sense amplifier contained in each MAT. It is required to determine write data in the next cycle in accordance with the verify result.

An NMOS transistor N111 given a voltage VPRE on the drain has a gate, which serves as a data storage node DDC for temporarily saving and holding write data held on the node PDC in the data latch 112 at the time of write. Write data on the node PDC in the data latch 112 is transferred to the data storage node DDC via a transfer NMOS transistor N114. The voltage VPRE is turned to Vdd or Vss selectively.

The NMOS transistor N111 and an NMOS transistor N117 interposed between the former and the data storage node TDC make it possible to set data on the data storage node TDC in accordance with the data on the data storage node DDC. Namely, the NMOS transistors N111, N117 configure a write-back circuit operative to write the next-cycle write data back to the storage node TDC.

In accordance with pieces of data held on the data storage nodes DDC, BDC, and in accordance with the selection of the drain voltage VPRE on the transistors N111, N112, the data node TDC is forcibly discharged (that is, set to "L" level) or charged (that is, set to "H" level) at the time of verify read, as can be controlled.

The data latch 112 is connected to a verify check circuit 114. The data latch 112 has one node connected to the gate of an NMOS transistor N122, that is, a check transistor, which has a source grounded via an NMOS transistor N121 controlled by a check signal CHK1, and a drain connected via paralleled NMOS transistors N123, N124 to a common signal line COM shared by sense units in one page. The NMOS transistors N123, N124 have respective gates, which are controlled by a check signal CHK2 and the node TDC.

Only if "0" write is determined insufficient as a result of verify read, write-back is executed such that the node PDC in the data latch 112 becomes "L" ("0"). Namely, after completion of one page write, the data latches 112 are verify-controlled to exhibit all "1".

At the time of data write, the verify check circuits 114 turn on in sense units in one page after verify read. If write is not completed in a certain sense unit, the verify check circuit 114 discharges the common signal line COM previously charged to "H". When the data latches 112 in one page reach the state of all "1", the common signal line COM is not discharged and holds "H", which becomes a pass flag indicative of write completion.

In the present embodiment, there may be 4 bits of data input in one time as described in the first embodiment. In this case, not only data load can be executed bit by bit to 4 MATs, but also the following data input can be executed because each MAT includes plural sense amplifier circuits S/A.

For example, each MAT includes 16 sense amplifier circuits, 4 bits of input data are loaded to one MAT four times successively. Sequential repetitions of this operation to the following MATs allow data load to be executed to all MATs.

In a further example, first 4 bits of input data are loaded in a certain MAT and the next 4 bits of input data are loaded in the next MAT. Repetitions of the above operation make it possible to adjust the number of pieces of data loaded in the MATs, thereby adjusting the number of MATs simultaneously operative at the time of write and at the time of erase, or the number of sense amplifier circuits S/A.

The number of sense amplifier circuits S/A contained in one MAT can be determined arbitrarily in consideration of the arrangement space immediately beneath the MAT, power consumption at the time of erasing, the influence by heat produced from memory cells, and so forth. Further, the number of MATs simultaneously operative and the number of memory cells (or sense amplifier circuits S/A) simultaneously operative in one MAT can be controlled as described above and accordingly more flexible design can be achieved.

For example, in the case of the present embodiment, the number of sense amplifier circuits S/A contained in one MAT can be determined around 16-32 in consideration of the space arrangement immediately beneath the cell array. In this case, at the time of write with relatively small power consumption and less influence by heat produced from memory cells, the number of memory cells simultaneously operative in one MAT becomes 16-32 similar to the sense amplifier circuits S/A. On the other hand, at the time of erase with larger power consumption and larger influence by heat produced from memory cells than those at the time of write, the number of MATs simultaneously operative and the number of memory cells simultaneously operative in one MAT are controlled smaller, thereby ensuring the fast operation at the time of write while ensuring the stability at the time of erase.

The present embodiment makes it possible to exert the same effect as the first embodiment and additionally execute faster write processing than the first embodiment.

The column control circuit 2' of the present embodiment is similarly applicable to the second through fifth embodiments.

[Others]

The embodiments of the present invention have been described above though the present invention is not limited to the above embodiments.

Figure 20:
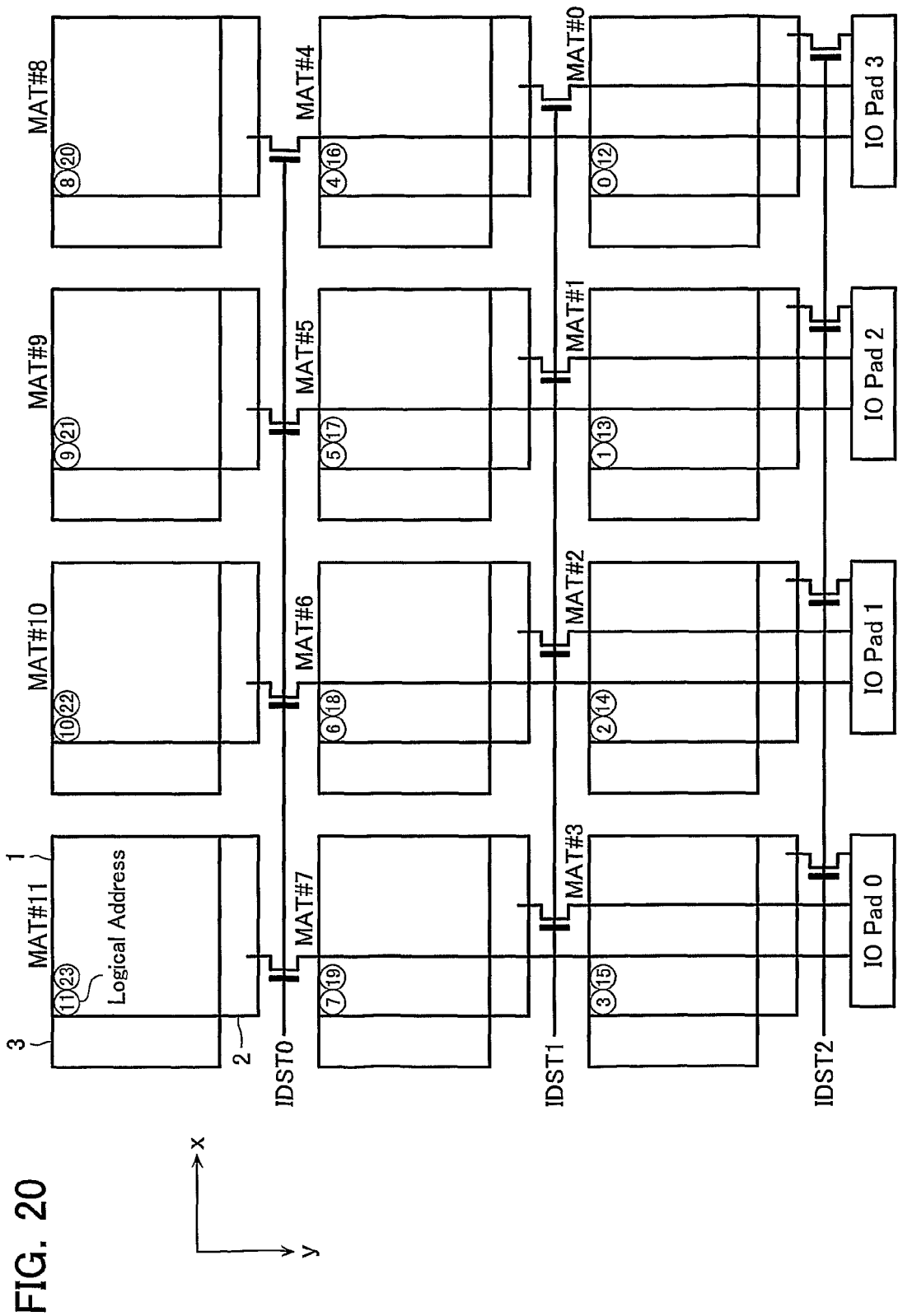
FIG. 20 is a block diagram showing an arrangement of MATs and logical addresses of memory cells in a cell array in a nonvolatile memory according to another embodiment.

For example, if MAT#11, . . . , #0 are arranged in the blocks BLK#0, . . . , #11 in the cell array as shown in FIG. 20, the MATs may be arranged or assigned with logical addresses such that mutual positions of memory cells contained in each page, or mutual positions of memory cells contained in different pages are separated from each other.

In the above embodiments, writing is mainly described though erasing is also executed similarly.

The present invention is also applicable to various semiconductor memory devices other than the nonvolatile memory.

The invention claimed is:

1. A nonvolatile semiconductor memory device, comprising:
   a cell array including plural MATs (unit cell arrays) arranged in a matrix, each MAT including a plurality of first lines, a plurality of second lines intersecting said plurality of first lines, and a plurality of memory cells connected at intersections of said first and second lines between both lines, each memory cell including a serial circuit of an electrically erasable programmable variable resistive element of which resistance is nonvolatilely stored as data;
   a plurality of access circuits independently connected to said MATs, respectively; and
   IO pads each provided at Nm1 said MATs (Nm1=an integer of 1 or more),
   wherein said access circuits are configured to execute data input/output to/from said Nm1 MATs from/to said IO pads,
   each of Nm access circuits (Nm=an integer of 2 or more) of said plurality of access circuits accesses Nc memory cells (Nc=an integer of 1 or more) of said plurality of memory cells in corresponding MATs, simultaneously, and
   each of said access circuits includes a latch circuit operative to store information whether said MAT is failed or not.

2. The nonvolatile semiconductor memory device according to claim 1, wherein said Nm×Nc memory cells, which are simultaneously accessed, configure one page, and said Nc memory cells included in a certain page are physically separated from said memory cells included in another page logically adjacent to said certain page.

3. The nonvolatile semiconductor memory device according to claim 1, wherein said Nm×Nc memory cells, which are simultaneously accessed, configure one page, and said Nc memory cells included in a plurality of logically continued pages and belonging to the same MAT are physically separated from each other.

4. The nonvolatile semiconductor memory device according to claim 2, wherein said access circuits execute one page data input/output in plural data input/output cycles.

5. The nonvolatile semiconductor memory device according to claim 4, wherein a certain one of said data input/output cycles and the following data input/output cycle have different access target MATs.

6. The nonvolatile semiconductor memory device according to claim 1, wherein said access circuits include a plurality of sense amplifier circuits operative to sense/amplify data on a MAT basis.

7. The nonvolatile semiconductor memory device according to claim 1, wherein each of said plurality of memory cells includes a non-ohmic element, and said non-ohmic element is a diode.

8. A nonvolatile semiconductor memory device, comprising:
- a cell array including plural MATs (unit cell arrays) arranged in a matrix, each MAT including a plurality of first lines, a plurality of second lines intersecting said plurality of first lines, and a plurality of memory cells connected at intersections of said first and second lines between both lines, each memory cell including a serial circuit of an electrically erasable programmable variable resistive element of which resistance is nonvolatilely stored as data; and
- a plurality of access circuits independently connected to said MATs, respectively,
- wherein each of said access circuits accesses the same number of said memory cells in a corresponding MAT simultaneously,
- a group comprises a plurality of said memory cells accessed simultaneously,
- said memory cells belonging to a certain group and said memory cells belonging to another group are arranged spaced apart more than one memory cell in a certain direction, said certain group and said another group having adjacent logical addresses, and
- each of said access circuits includes a latch circuit operative to store information whether said MAT is failed or not.

9. The nonvolatile semiconductor memory device according to claim 8, further comprising a global word line and a local address line,
- wherein each of said access circuits includes a row control circuit connected to said global word line and said local address line, and
- said plurality of access circuits selects said plurality of MATs simultaneously.

10. The nonvolatile semiconductor memory device according to claim 8, further comprising IO pads each provided at Nm1 MATs (Nm1=an integer of 1 or more),
- wherein, when inputting Nd-bit data (Nd=an integer of 2 or more), said Nd-bit data is transferred to Nd access circuits via said IO pads one bit at a time.

11. The nonvolatile semiconductor memory device according to claim 10, wherein each of said Nd access circuits accesses one memory cell in a corresponding MAT.

12. A nonvolatile semiconductor memory device, comprising:
- a cell array including plural MATs (unit cell arrays) arranged in a matrix, each MAT including a plurality of first lines, a plurality of second lines intersecting said plurality of first lines, and a plurality of memory cells connected at intersections of said first and second lines between both lines, each memory cell including a serial circuit of an electrically erasable programmable variable resistive element of which resistance is nonvolatilely stored as data; and
- a plurality of access circuits independently connected to said MATs, respectively,
- wherein each of said access circuits accesses the same number of said memory cells in a corresponding MAT simultaneously,
- a group comprises a plurality of said memory cells accessed simultaneously,
- said memory cells belonging to said group are included in different MATs respectively, and are arranged spaced apart more than one MAT in a certain direction, and
- each of said access circuits includes a latch circuit operative to store information whether said MAT is failed or not.

13. The nonvolatile semiconductor memory device according to claim 12, further comprising a global word line and a local address line,
- wherein each of said access circuits includes a row control circuit connected to said global word line and said local address line, and
- said plurality of access circuits selects said plurality of MATs simultaneously.

14. The nonvolatile semiconductor memory device according to claim 12, further comprising IO pads each provided at Nm1 MATs (Nm1=an integer of 1 or more),
- wherein, when inputting Nd-bit data (Nd=an integer of 2 or more), said Nd-bit data is transferred to Nd access circuits via said IO pads one bit at a time.

15. The nonvolatile semiconductor memory device according to claim 14, wherein each of said Nd access circuits accesses one memory cell in a corresponding MAT.

\* \* \* \* \*